US011319396B2

(12) United States Patent
Martin et al.

(10) Patent No.: US 11,319,396 B2
(45) Date of Patent: May 3, 2022

(54) STAR-SHAPED AND TRIBLOCK POLYMERS WITH ENHANCED CROSSLINKABILITY

(71) Applicant: BASF SE, Ludwigshafen am Rhein (DE)

(72) Inventors: Emmanuel Martin, Basel (CH); Fulvio Giacomo Brunetti, Ludwigshafen (DE); Daniel Kaelblein, Ludwigshafen (DE); Konrad Knoll, Ludwigshafen (DE); Jordan Thomas Kopping, Ludwigshafen (DE)

(73) Assignee: BASF SE, Ludwigshafen am Rhein (DE)

( * ) Notice: Subject to any disclaimer, the term of this patent is extended or adjusted under 35 U.S.C. 154(b) by 328 days.

(21) Appl. No.: 16/336,660

(22) PCT Filed: Sep. 20, 2017

(86) PCT No.: PCT/EP2017/073689
§ 371 (c)(1),
(2) Date: Mar. 26, 2019

(87) PCT Pub. No.: WO2018/060016
PCT Pub. Date: Apr. 5, 2018

(65) Prior Publication Data
US 2020/0317847 A1    Oct. 8, 2020

(30) Foreign Application Priority Data

Sep. 27, 2016 (EP) .................................... 16190842

(51) Int. Cl.
*C08F 297/04* (2006.01)
*H01L 51/05* (2006.01)

(52) U.S. Cl.
CPC .......... *C08F 297/04* (2013.01); *H01L 51/052* (2013.01); *C08F 2810/20* (2013.01)

(58) Field of Classification Search
CPC ...... C08F 297/04; C08F 2810/20; C08K 5/28; C08K 5/0025; C08L 53/02; C08L 53/00
See application file for complete search history.

(56) References Cited

U.S. PATENT DOCUMENTS

| 4,673,714 A | * | 6/1987 | Kishimoto | ........... B01J 31/2295 525/314 |
| 4,910,261 A | * | 3/1990 | Kaszas | .................. C08F 297/00 522/126 |

(Continued)

FOREIGN PATENT DOCUMENTS

| CN | 101747543 A | 6/2010 |
| CN | 105319841 A | 2/2016 |

(Continued)

OTHER PUBLICATIONS

Extended European Search Report dated Mar. 22, 2017 in European Patent Application No. 16190842.1, 3 pages.

(Continued)

*Primary Examiner* — Mark S Kaucher
(74) *Attorney, Agent, or Firm* — Armstrong Teasdale LLP

(57) ABSTRACT

The present invention provides compositions comprising a) at least one polymer consisting of one polymerblock A and at least two polymerblocks B, wherein each polymerblock B is attached to the polymerblock A, and wherein at least 60 mol % of the monomer units of polymerblock B are selected from the group consisting of Formulae (1A), (1B), (1C), (1D), (1E), (1F) and 1G, 1H and 1I wherein $R^1$, $R^2$, $R^3$, $R^4$, $R^5$, $R^6$, $R^7$ and $R^8$ are independently and at each occurrence H or $C_{1-10}$-alkyl, and b) at least one crosslinking agent carrying at least two azide groups, as well as to layers formed from these compositions, electronic devices comprising these layers and to specific polymers encompassed by the polymers of the composition.

(Continued)

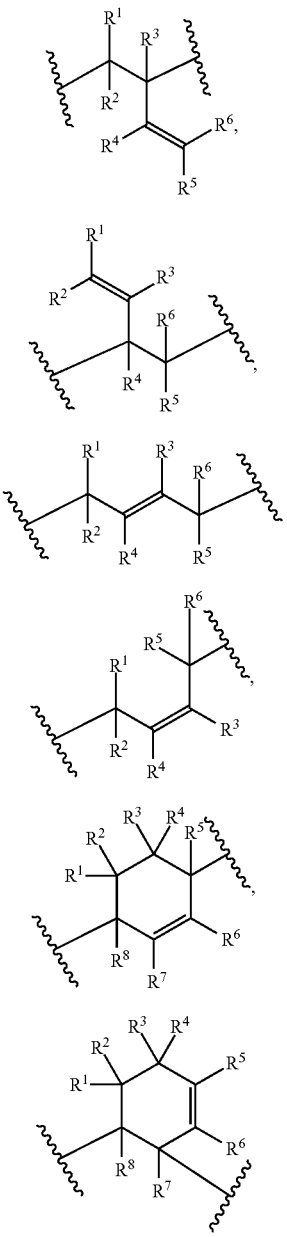

(56) References Cited

U.S. PATENT DOCUMENTS

| | | |
|---|---|---|
| 6,420,093 B1 | 7/2002 | Ohba et al. |
| 2002/0102494 A1 | 8/2002 | Ohba et al. |
| 2002/0102495 A1 | 8/2002 | Ohba et al. |
| 2011/0054069 A1 | 3/2011 | Chen |
| 2012/0068314 A1* | 3/2012 | Kastler .............. H01G 4/33 257/632 |
| 2014/0370712 A1 | 12/2014 | Kim et al. |
| 2016/0155633 A1* | 6/2016 | Zhou .............. C08J 3/24 257/632 |

FOREIGN PATENT DOCUMENTS

| | | |
|---|---|---|
| CN | 105849170 A | 8/2016 |
| DE | 2 056 375 | 6/1971 |
| DE | 35 14 063 A1 | 11/1985 |
| EP | 0 346 919 A2 | 12/1989 |
| EP | 1 078 970 A1 | 2/2001 |
| GB | 1109616 | 4/1968 |
| JP | 6-313107 A | 11/1994 |
| WO | WO 01/58230 A1 | 8/2001 |
| WO | WO 2004/100282 A2 | 11/2004 |
| WO | WO 2005/049695 A1 | 6/2005 |
| WO | WO 2007/004995 A1 | 1/2007 |
| WO | WO 2008/000664 A1 | 1/2008 |
| WO | WO 2009/068884 A1 | 6/2009 |
| WO | WO 2010/049321 A1 | 5/2010 |
| WO | WO 2010/049323 A1 | 5/2010 |
| WO | WO 2010/108873 A1 | 9/2010 |
| WO | WO 2010/115767 A1 | 10/2010 |
| WO | WO 2010/136352 A1 | 12/2010 |
| WO | WO 2010/136353 A1 | 12/2010 |
| WO | WO 2011/068482 A1 | 6/2011 |
| WO | WO 2013/083506 A1 | 6/2013 |
| WO | WO 2015/004563 A1 | 1/2015 |

OTHER PUBLICATIONS

Hirao, A., et al., "Synthesis of Chain-End-Functionalized Poly(methyl methacrylate)s with a Definite Number of Benzyl Bromide Moieties and Their Application to Star-Branched Polymers", Macromolecules, vol. 36, Issue 26, 2003, pp. 9742-9751.

Pispas, S., et al., "Block copolymers with crystalline/amorphous, crystalline/polyelectrolyte and amorphous/polyelectroiyte blocks", Macromolecular Chemistry and Physics, vol. 203, Issue 10-11, Jul. 2002, pp. 1317-1327.

Qin, S., et al., "Synthesis of Triblock Copolymers Containing Potyisoprene Segments Using lniferter Technique", Acta Polymerica Sinica, vol. 4, Aug. 2001, pp. 549-554.

International Search Report dated Nov. 27, 2017 in PCT/EP2017/073689 filed on Sep. 20, 2017.

\* cited by examiner

13 Claims, 2 Drawing Sheets

STAR-SHAPED AND TRIBLOCK POLYMERS WITH ENHANCED CROSSLINKABILITY

The present invention relates to compositions comprising at least one polymer suitable for use as dielectric material, to a layer formed from these compositions, to an electronic device comprising this layer and to specific polymers suitable for use as dielectric material in the compositions of the present invention.

Field effect transistors (FETs) can be used in many devices that require electronic functionalities such as displays, large-area sensors and radio-frequency identification (RFID) tags.

The preparation of field effect transistors (FET) usually comprises the application and structuring, also called patterning, of various layers such as the application and structuring of the electrodes, as well as, the application and structuring of the semiconducting layer, the dielectric layer and of other layers such as levelling, passivation and barrier layers.

The electrode material is usually applied by evaporation followed by structuring of the electrode material layer using photolithography, which involves the application of a photoresist-layer, exposure of the photoresist-layer to radiation using a mask, removal of the photo-resist not-exposed to radiation, etching of the exposed electrode material, and removal of the remaining photo-resist.

The most convenient way to apply the semiconducting layer, the dielectric layer and other layers such as barrier layers is by solution processing techniques such as spin coating or printing as liquid processing techniques allow the production of low cost field effect transistors. In addition, liquid processing techniques are also compatible with plastic substrates, and thus allow the production of lightweight and mechanically flexible devices.

When using liquid processing techniques, it is important that the solution of the layer to be applied does not dissolve the layer already present in the device. Thus, one needs to either use solvents that do not dissolve the layer already present, so-called orthogonal solvents, or render the layer already present in the device insoluble or less soluble towards the solvent of the next layer to be applied. One way to render a polymer layer insoluble or less soluble towards the solvent of the next layer to be applied is by cross-linking this polymer layer. Depending on the crosslinking agents used, the crosslinking can be initiated by thermal treatment or by radiation treatment. Radiation treatment has the advantage compared to thermal treatment that by using a mask only part of the polymer layer is cross-linked so that the cross-linking and the structuring step can be combined in one step. The not cross-linked polymer can be easily removed by washing with a suitable solvent, whereas structuring of a polymer layer cross-linked by thermal treatment is usually performed using photolithography, which involves a serious of steps as outlined above for the application and structuring of the electrodes.

For technical convenience, it is favored that the cross-linking is initiated by radiation treatment using UV radiation of 365 nm as this is the standard wavelength for commonly used photoresist-layers. Thus, there is no need to adjust the wavelength of the photo-device or even to replace the photo-device by a radiation device suitable for cross-linking the polymer during the preparation process of the device.

WO 2015/004563 describes bis-azide crosslinking agents suitable for crosslinking semiconducting, respectively, dielectric materials in order to form crosslinked semiconducting, respectively, crosslinked dielectric layers in field effect transistors using UV radiation of 365 nm. The commonly used dielectric material in WO 2015/004563 is polystyrene. However, polystyrene as dielectric material has the disadvantage that the crosslinking reaction with the bis-azide crosslinking agent has to be performed either under inert gas atmosphere such as nitrogen atmosphere or using a high dosage of radiation in order to obtain a cross-linked dielectric layer, which is highly crosslinked as can be seen by a high film retention ratio d2/d1. In the film retention ratio, d1 is the thickness of the dielectric layer after cross-linking and before development and d2 is the thickness of the dielectric layer after cross-linking and after development.

Thus, there is a need for compositions comprising a) a material suitable for use as dielectric materials and b) a crosslinking agent carrying at least two azide groups, and wherein the material shows improved crosslinkability regarding the crosslinking agent at low-dosage UV radiation and under ambient conditions.

Star-shaped polymers and triblock polymers are known in the art.

EP0346919A2 describes a polymerization process for preparing block copolymers, which exhibit both elastomeric and thermoplastic properties. Example 13 describes the crosslinking of a copolymer comprising polyisobutylene blocks and partially cyclized polyisoprene outer blocks in the presence of 2,6-bis(4-azidobenzilidene)-4-methyl cyclohexanone. EP0346919A2 does not relate to electronic devices.

Akira Hirao, Akira Matsuo Macromolecules 2003, 36(26), 9742 to 9751 describes chain-end functionalized poly(methyl methacrylates) core including $AB_4$ star-branched polymer, wherein A is poly(methyl methacrylate) and B is polyisoprene.

Qin, Shuhui; Qui, Kunyuan Gaofenzi Xuebao 2001, 4, 549-552 describes polyisoprene-b-polystyrene-b-polyisoprene triblock copolymers and polyisoprene-b-poly(methyl methacrylate)-b-polyisoprene triblock copolymers. The majority of polyisoprene is added by 1,4-addition.

US2014/0370712 describes a method of forming a pattern. This method involves forming a block copolymer layer on another layer and inducing phase separation of the block copolymer layer. Examples of block copolymers are triblock copolymers such as polybutadiene-block-poly(methyl methacrylate)-block-polybutadiene, polyisoprene-block-poly(methyl methacrylate)-block-polyisoprene.

Stergios Pispas, Ekaterini Siakali-Lioulafa, Nikos Hadjichristidis, Thomas Mavromoustakos Macromolecular Chemistry and Physics 2002, 203, 1317 to 1327 describes the preparation of diblock and triblock copolymers containing polybutadiene with high 1,4-addition of butadiene and poly(tert-butyl methacrylate) blocks.

The object is solved by the composition, the layer, the electronic device, and the polymer described herein.

The composition of the present invention comprises a) at least one polymer consisting of one polymerblock A and at least two polymerblocks B, wherein each polymerblock B is attached to the polymerblock A, and wherein at least 60 mol % of the monomer units of polymerblock B are selected from the group consisting of (1A) 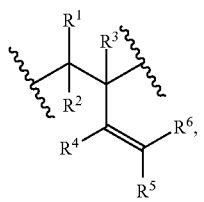

(1B) 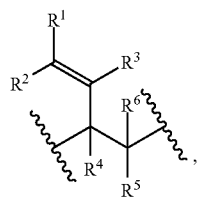

(1C) 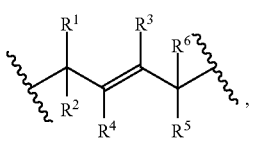

(1D) 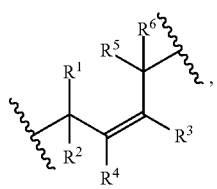

(1E) 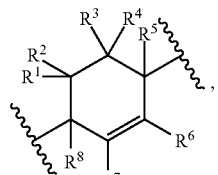

(1F) 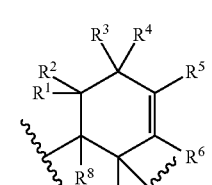

(1G) 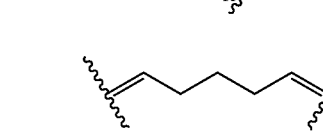

(1H) 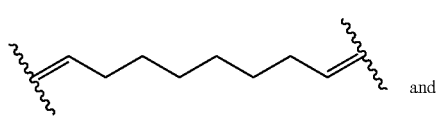

(1I) 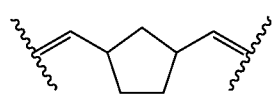

wherein
$R^1$, $R^2$, $R^3$, $R^4$, $R^5$, $R^6$, $R^7$ and $R^8$ are independently and at each occurrence H or $C_{1-10}$-alkyl, and
b) at least one crosslinking agent carrying at least two azide groups.

If the polymer is a polymer consisting of one polymerblock A and two polymerblocks B, the polymer is a so-called "triblockpolymer".

If the polymer is a polymer consisting of one polymerblock A and more than two polymerblocks B, the polymer is a so-called "star-shaped polymer".

$C_{1-4}$-alkyl, $C_{1-6}$-alkyl, $C_{1-10}$-alkyl, $C_{1-20}$-alkyl and $C_{1-30}$-alkyl can be branched or unbranched. Examples of $C_{1-4}$-alkyl are methyl, ethyl, butyl, iso-butyl, sec-butyl and tert-butyl. Examples of $C_{1-6}$-alkyl are $C_{1-4}$-alkyl, pentyl, isopentyl and hexyl. Examples of $C_{1-10}$-alkyl are $C_{1-6}$-alkyl, heptyl, octyl, 1,1-dimethyl-3,3-dimethylbutyl, nonyl and decyl. Examples of $C_{1-20}$-alkyl and $C_{1-30}$-alkyl are $C_{1-10}$-alkyl, undecyl, dodecyl, tridecyl, tetradecyl, pentadecyl, hexadecyl, heptadecyl, octadecyl, nonadecyl and eicosyl.

Examples of $C_{6-14}$-aryl are phenyl and naphthyl.

Examples of 5 to 14 membered heteroaryl are

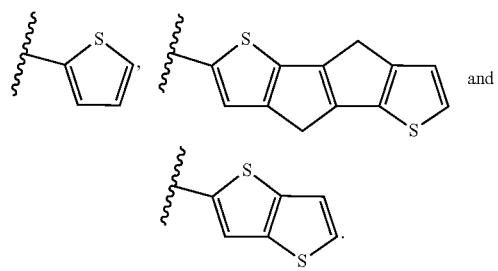

Examples of $C_{1-10}$-alkylene are methylene, ethylene, propylene, butylene, pentylene, hexylene, heptylene, octylene, nonylene and decylene.

Examples of $C_{2-10}$-alkylene are ethenylene, propenylene, butenylene, pentenylene, hexenylene, heptenylene, octenylene, nonenylene and decenylene.

Examples of $C_{2-10}$-alkynylene are ethynylene, propynylene, butynylene, pentynylene, hexynylene, heptynylene, octynylene, nonynylene and decynylene.

Examples of $C_{6-14}$-arylene are

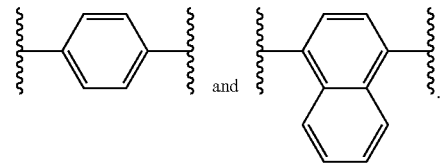 [SMILES: *c1ccc(*)cc1 ; *c1ccc(*)c2ccccc12]

Examples of $C_{5-8}$-cycloalkylene are cyclopentylene, cyclohexylene, cycloheptylene and cyclooctylene.

Examples of 5 to 14 membered heteroarylene are

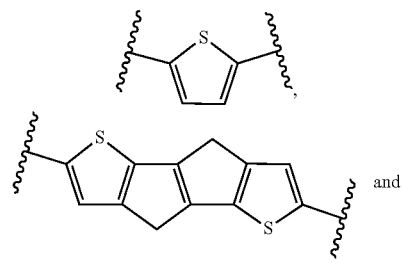

-continued

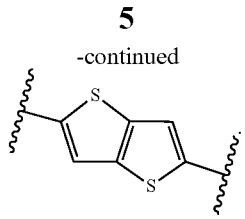

An example of a polycyclic system containing at least one ring selected from the group consisting of $C_{6-14}$-aromatic ring and 5 to 14 membered heteroaromatic ring is

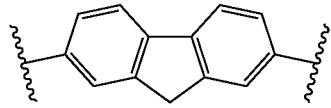

Examples of halogen are F, Cl, Br and I.

Preferably, $R^1$, $R^2$, $R^3$, $R^4$, $R^5$ and $R^6$ are independently and at each occurrence H or $C_{1-4}$-alkyl. More preferably, $R^1$, $R^2$, $R^3$, $R^4$, $R^5$ and $R^6$ are H.

Preferably, at least 60 mol % of the monomer units of polymerblock B are selected from the group consisting of

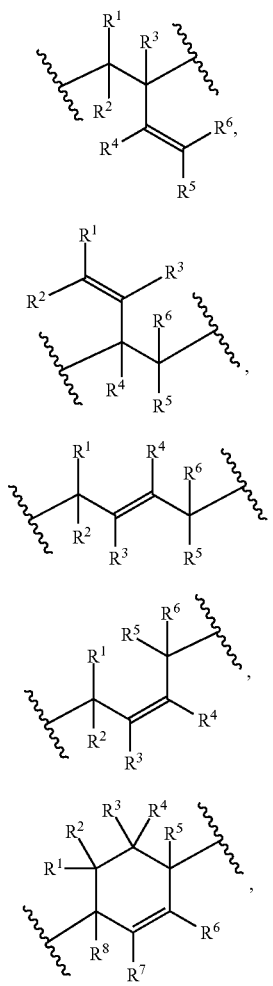

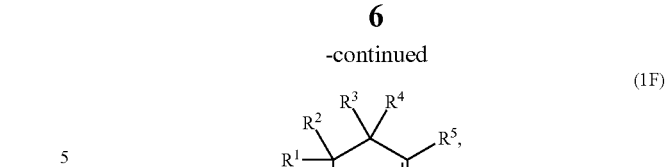

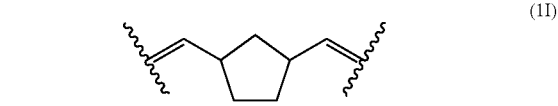

wherein
$R^1$, $R^2$, $R^3$, $R^4$, $R^5$, $R^6$, $R^7$ and $R^8$ are independently and at each occurrence H or $C_{1-4}$-alkyl.

Examples of monomer units of formula 1A, 1B, 1C and 1D are

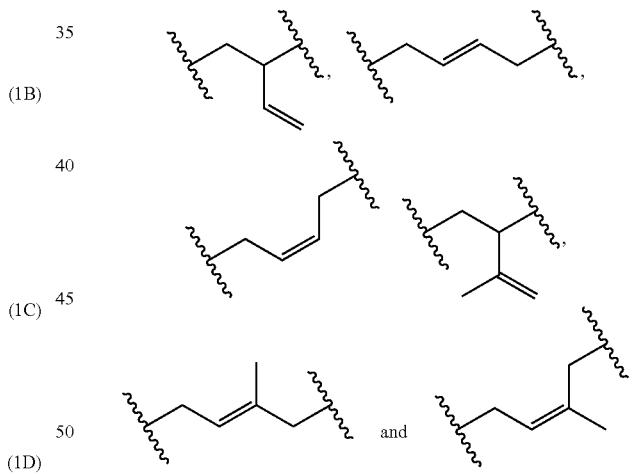

Examples of monomer units of formula 1E and 1F are

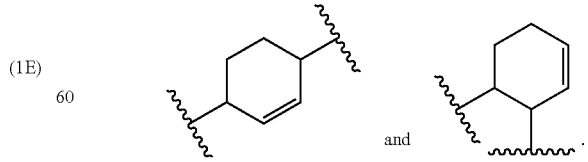

More preferably, at least 70 mol % of the monomer units of the polymerblock B are selected from the group consisting of

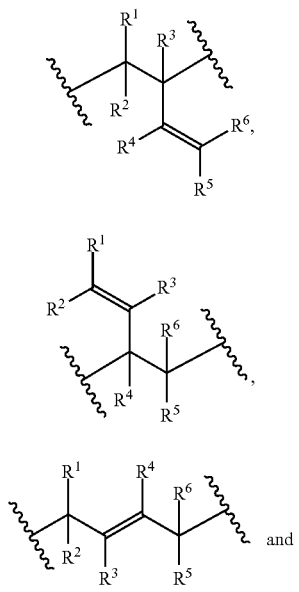

(1A)

(1B)

(1C) and (1D)

wherein $R^1$, $R^2$, $R^3$, $R^4$, $R^5$ and $R^6$ are independently and at each occurrence H or $C_{1-4}$-alkyl.

More preferably, at least 80 mol % of the monomer units of the polymerblock B are selected from the group consisting of

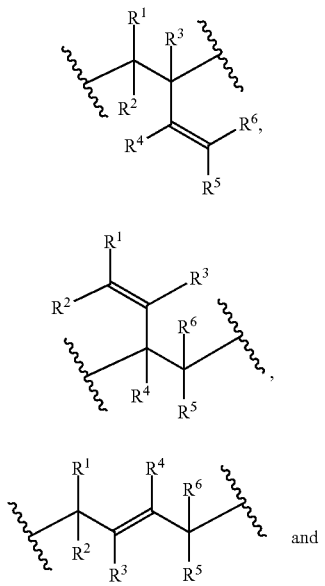

(1A)

(1B)

(1C) and (1D)

wherein
$R^1$, $R^2$, $R^3$, $R^4$, $R^5$ and $R^6$ are H.

The polymerblock B can contain further monomer units, such as monomer units (4A), (4C), (4D), (4E) or (4F). However, most preferred, polymerblock B essentially consists of monomer units selected from the group consisting of (1A), (1B), (1C), (1D), (1E), (1F), (1G), (1H) and (1I).

The polymerblock A can consist of any suitable monomer units.

Preferably, at least 80 mol % of the monomer units of polymerblock A are selected from the group consisting of

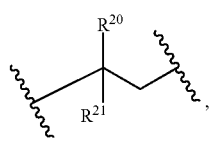

(4A)

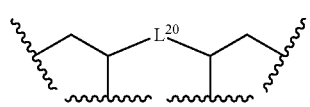

(4B)

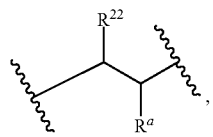

(4C)

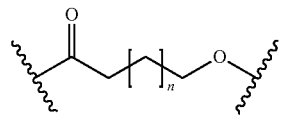

(4D)

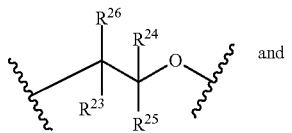

(4E) and

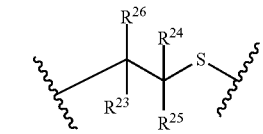

(4F)

wherein
$R^{20}$, $R^{21}$, $R^{22}$, $R^{23}$, $R^{24}$, $R^{25}$ and $R^{26}$ are independently and at each occurrence selected from the group consisting of H, $C_{6-14}$-aryl, 5 to 14 membered heteroaryl and $C_{1-30}$-alkyl, and $R^a$ is C(O)OH, C(O)O$C_{1-30}$-alkyl, C(O)—H, C(O)$C_{6-14}$-aryl, C(O)N($C_{1-30}$-alkyl)$_2$, C(O)N($C_{6-14}$-aryl)-$_2$, C(O)N($C_{1-30}$-alkyl)($C_{6-14}$-aryl), C(O)—$C_{6-14}$-aryl, C(O)—$C_{1-30}$-alkyl, O—$C_{6-14}$-aryl, C—$C_{1-30}$-alkyl, OC(O)$C_{1-30}$-alkyl, OC(O)$C_{6-14}$-aryl or CN, wherein C$_{6-14}$-aryl and 5-14 membered heteroaryl can be substituted with one or more substituents selected from the group consisting of C$_{1-10}$-alkyl, C(O)OH, C(O)OC$_{1-10}$-alkyl, C(O)phenyl, C(O)N(C$_{1-10}$-alkyl)$_2$, C(O)N(phenyl)$_2$, C(O)N(C$_{1-10}$-alkyl)(phenyl), C(O)-phenyl, C(O)—C$_{1-10}$-alkyl, OH, O-phenyl, O—C$_{1-10}$-alkyl, OC(O)C$_{1-10}$-alkyl, OC(O)-phenyl, CN and NC$_2$, and C$_{1-30}$-alkyl can be substituted with one or more substituents selected from the group consisting of phenyl, C(O)OH, C(O)OC$_{1-10}$-alkyl, C(O)phenyl, C(O)N(C$_{1-10}$-alkyl)$_2$, C(O)N(phenyl)$_2$, C(O)N(C$_{1-10}$-alkyl)(phenyl), C(O)-phenyl, C(O)—C$_{1-10}$-alkyl, O-phenyl, O—C$_{1-10}$-alkyl, OC(O)C$_{1-10}$-alkyl, OC(O)-phenyl, Si(C$_{1-10}$-alkyl)$_3$, Si(phenyl)$_3$, CN and NC$_2$, n is an integer from 1 to 3, and L$^{20}$ is C$_{1-10}$-alkylene, C$_{2-10}$-alkenylene, C$_{2-10}$-alkynylene, C$_{6-14}$-arylene or S(O).

If polymerblock A contains monomer unit 4B, the polymer is a star-shaped polymer.

Examples of monomer units 4A are

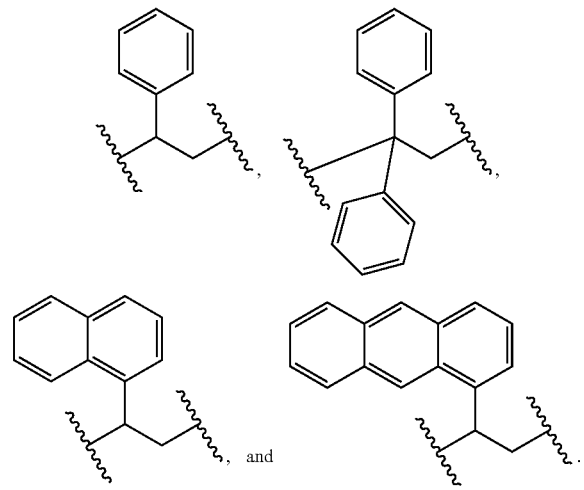

An examples of a monomer unit 4B is

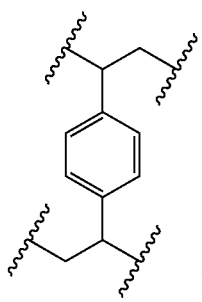

Examples of monomer units 4C are

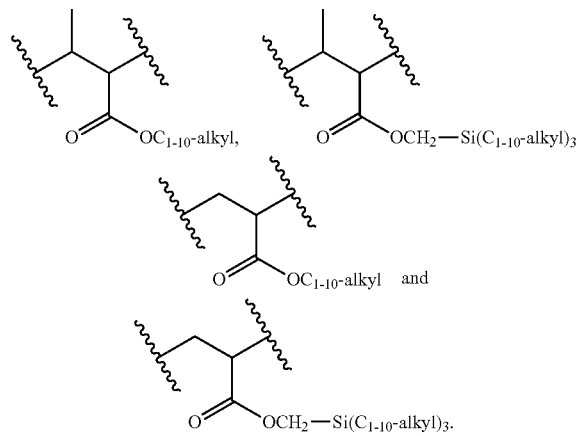

More preferably, at least 80 mol % of the monomer units of polymerblock A are selected from the group consisting of

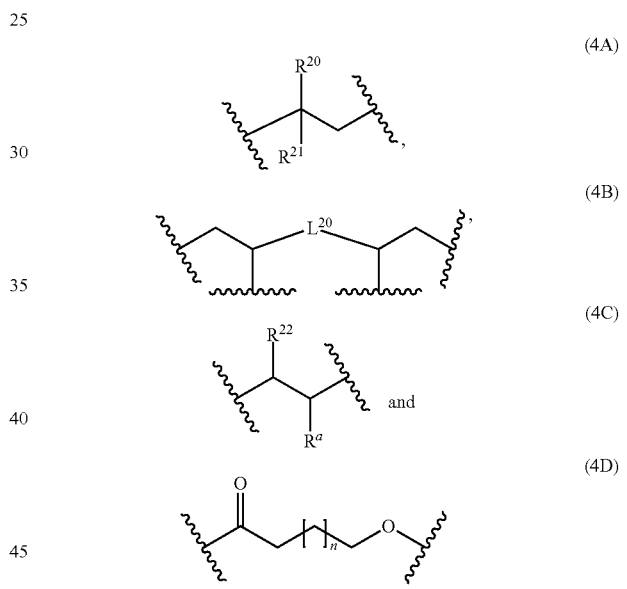

wherein

R$^{20}$, R$^{21}$ and R$^{22}$ are independently selected from the group consisting of H, C$_{6-14}$-aryl, 5 to 14 membered heteroaryl and C$_{1-30}$-alkyl, and R$^a$ is C(O)OC$_{1-30}$-alkyl, wherein C$_{6-14}$-aryl and 5-14 membered heteroaryl can be substituted with one or more C$_{1-10}$-alkyl, and C$_{1-30}$-alkyl can be substituted with one or more substituents selected from the group consisting of Si(C$_{1-10}$-alkyl)$_3$ and Si(phenyl)$_3$, and n is an integer from 1 to 3, and L$^{20}$ is C$_{1-10}$-alkylene or C$_{6-14}$-arylene.

Even more preferably, at least 90 mol % of the monomer units of polymerblock A is a monomer unit selected from the group consisting of

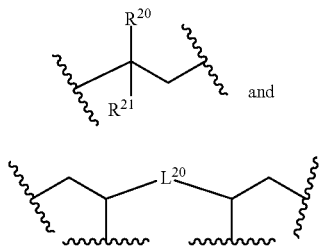

(4A)

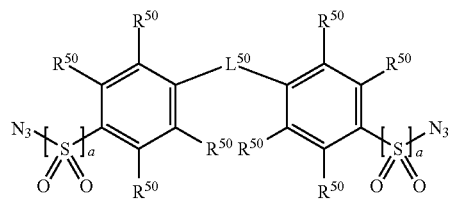

(2)

wherein
a is 0 or 1,
$R^{50}$ is at each occurrence selected from the group consisting of H, halogen, $SO_3M$ and $C_{1-20}$-alkyl, which $C_{1-20}$-alkyl can be substituted with one or more halogen,
wherein M is H, Na, K or Li, and
$L^{50}$ is a linking group.
Preferably, a is 0.
Preferably, $R^{50}$ is at each occurrence selected from the group consisting of F, $SO_3M$ and $C_{1-20}$-alkyl, which $C_{1-20}$-alkyl can be substituted with one or more F,
wherein M is Na, K or Li.
More preferably, $R^{50}$ is at each occurrence F.
$L^{50}$ can be any suitable linking group.
Preferably, $L^{50}$ is a linking group of formula wherein
$R^{20}$ and $R^{21}$ are independently selected from the group consisting of H and $C_{6-14}$-aryl,
wherein
$C_{6-14}$-aryl can be substituted with one or more $C_{1-10}$-alkyl,
and
$L^{20}$ is $C_{6-14}$-arlyene.

Most preferably, at least 90 mol % of the monomer units of polymerblock A is a monomer unit selected from the group consisting of

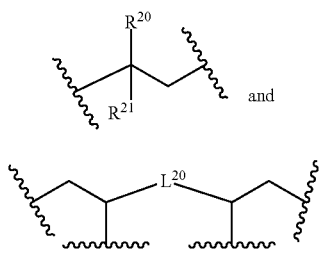

(4A)

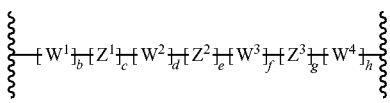

(3)

wherein
b, c, d, e, f, g and h are independently from each other 0 or 1, provided that b, c, d, e, f, g and h are not all at the same time 0,
$W^1$, $W^2$, $W^3$ and $W^4$ are independently selected from the group consisting of C(O), C(O)O, C(O)—$NR^{51}$, $SO_2$—$NR^{51}$, $NR^{51}$, $N^+R^{51}R^{51}$, $CR^{51}$=$CR^{51}$ and ethynylene
wherein
$R^{51}$ is at each occurrence H or $C_{1-10}$-alkyl, or two $R^{51}$ groups, which can be from different
$W^1$, $W^2$, $W^3$ and $W^4$ groups, together with the connecting atoms form a 5, 6 or 7 membered ring, which may be substituted with one to three $C_{1-6}$-alkyls,
$Z^1$, $Z^2$ and $Z^3$ are independently selected from the group consisting of $C_{1-10}$-alkylene, $C_{5-8}$-cycloalkylene, $C_{6-14}$-arylene, 5 to 14 membered heteroarylene and a polycyclic system containing at least one ring selected from $C_{6-14}$-aromatic ring and 5 to 14 membered heteroaromatic ring,
wherein
$C_{1-10}$-alkylene, $C_{5-8}$-cycloalkylene, $C_{6-14}$ membered arylene, 5 to 14 membered heteroarylene and polycyclic system containing at least one ring selected from $C_{6-14}$-aromatic ring and 5 to 14 membered heteroaromatic ring can be substituted with one to five $C_{1-20}$-alkyl or phenyl.
Examples of linking groups $L^{50}$ are

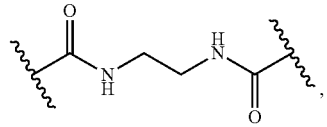

wherein
$R^{20}$ and $R^{21}$ are independently selected from the group consisting of H and phenyl, and
$L^{20}$ is phenylene.

The polymerblock A can additionally contain further monomer units, such as the monomer units, (1A), (1B), (1C), (1D), (1E), (1F), (1G), (1H) and (1I). However, most preferred, polymerblock A essentially consists of monomer units selected from the group consisting of (4A), (4B), (4C), (4D), (4E) and (4F).

In one embodiment of the composition of the present invention, the polymer consisting of one polymer block and at least two polymerblocks B is a polymer consisting of one polymerblock A and more than two polymerblocks B, and is a so-called "star-shaped polymer".

In another embodiment of the composition of the present invention, the polymer consisting of one polymer block and at least two polymerblocks B is a polymer of the present invention consisting of one polymerblock A and two polymerblocks B, a so-called "triblock polymer", as defined below.

Preferably, the crosslinking agent carrying at least two azide groups is a crosslinking agent carrying two azide groups.

Preferably, the crosslinking agent carrying two azide groups is of formula

-continued

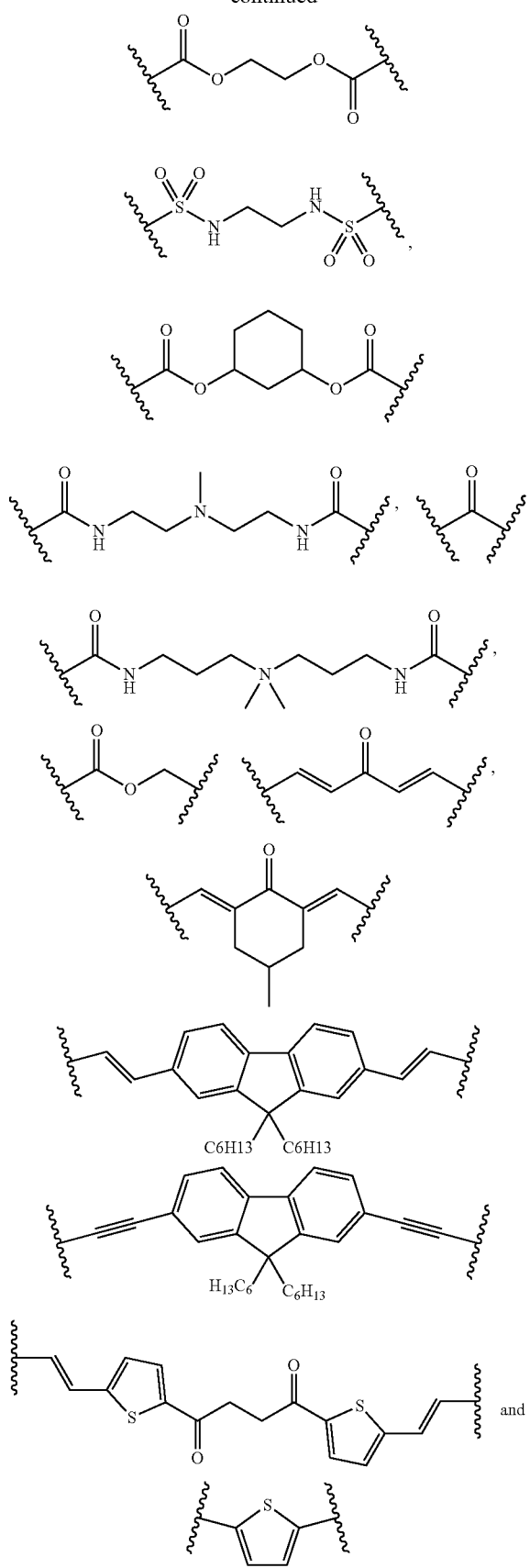

and

More preferably, $L^{50}$ is a linking group of formula

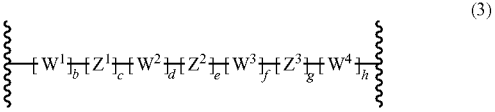

(3)

wherein
b, c, d, e, f, g and h are independently from each other 0 or 1, provided that at least one of c, e, and g is 1,
$W^1$, $W^2$, $W^3$ and $W^4$ are independently from each other selected from the group consisting of C(O), C(O)O, C(O)—$NR^{51}$, $SO_2$—$NR^{51}$, $NR^{51}$, $N^+R^{51}R^{51}$, $CR^{51}$=$CR^{51}$ and ethynylene Wherein
$R^{51}$ is at each occurrence H or $C_{1-10}$-alkyl, or two $R^{51}$ groups, which can be from different $W^1$, $W^2$, $W^3$ and $W^4$ groups, together with the connecting atoms form a 5, 6 or 7 membered ring, which may be substituted with one to three $C_{1-6}$-alkyls, $Z^1$, $Z^2$ and $Z^3$ are independently from each other selected from the group consisting of $C_{1-10}$-alkylene, $C_{5-8}$-cycloalkylene, $C_{6-14}$-arylene, 5 to 14 membered heteroarylene and polycyclic system containing at least one ring selected from $C_{6-14}$-aromatic ring and 5 to 14 membered heteroaromatic ring, wherein
$C_{1-10}$-alkylene, $C_{5-8}$-cycloalkylene, $C_{6-14}$ membered arylene, 5 to 14 membered heteroarylene and polycyclic system containing at least one ring selected from $C_{6-14}$-aromatic ring and 5 to 14 membered heteroaromatic ring can be substituted with one to five $C_{1-20}$-alkyl or phenyl, provided at least one of $Z^1$, $Z^2$ and $Z^3$ is $C_{6-14}$-arylene, 5 to 14 membered heteroarylene or polycyclic system containing at least one ring selected from $C_{6-14}$-aromatic ring and 5 to 14 membered heteroaromatic ring.

Most preferably, $L^{50}$ is a linking group of formula

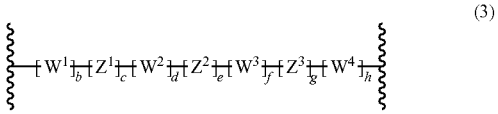

(3)

wherein
b, c, d, e, f, g and h are independently from each other 0 or 1, provided that at least one of c, e, and g is 1,
$W^1$, $W^2$, $W^3$ and $W^4$ are independently from each other selected from the group consisting of C(O), $CR^{51}$=$CR^{51}$ and ethynylene wherein
$R^{51}$ is H,
$Z^1$, $Z^2$ and $Z^3$ are independently from each other selected from the group consisting of $C_{1-10}$-alkylene, $C_{6-14}$-arylene, 5 to 14 membered heteroarylene, and polycyclic system containing at least one ring selected from $C_{6-14}$-aromatic ring and 5 to 14 membered heteroaromatic ring, wherein
$C_{1-10}$-alkylene, $C_{6-14}$ membered arylene, 5 to 14 membered heteroarylene and polycyclic system containing at least one ring selected from $C_{6-14}$-aromatic ring and 5 to 14 membered heteroaromatic ring can be substituted with one or two $C_{1-20}$-alkyl or phenyl, provided at least one of $Z^1$, $Z^2$ and $Z^3$ is $C_{6-14}$-arylene, 5 to 14 membered heteroarylene or polycyclic system containing at least one ring selected from $C_{6-14}$-aromatic ring and 5 to 14 membered heteroaromatic ring.

In particular, $L^{50}$ is

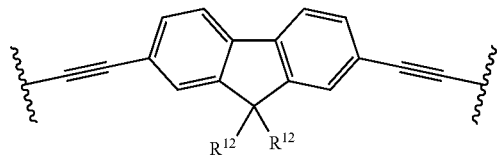

wherein $R^{12}$ is $C_{1-20}$-alkyl.

The preparation of crosslinking agents carrying at least two azide groups are described in various publications, for example WO 2015/004563, Cai, S. X.; Glenn, D. J.; Kanskar, M.; Wybourne, M. N.; Keana, J. F. W. Chem. Mater. 1994, 6, 1822-1829, Yan, M.; Cai, S. X.; Wybourne, M. N.; Keana, J. F. W. J. Mater. Chem. 1996, 6, 1249-1252, Touwslager, F. J.; Willard, N. P.; Leeuw, D. M. Applied Physics Letters 2002, 81, 4556, WO 04/100282, WO 2007/004995, WO 2009/068884, Png, R.-Q.; Chia, P.-J.; Tang, J.-C.; Liu, B.; Sivaramakrishnan S.; Zhou, M.; Khong, S.-H.; Chan, H. S. O.; Burroughes, J. H.; Chua, L.-L.; Friend, R. H.; Ho, P. K. H. Nature Materials 2010, 9(2), 152-152, and WO 2011/068482.

The composition of the present invention can also comprise a solvent. The solvent can be any suitable solvent or solvent mixture. Preferably, the solvent is a polar aprotic solvent or mixture of polar aprotic solvents. Examples of polar aprotic solvents are ethyl acetate, butyl acetate, acetone, cyclopentanone, tetrahydrofuran, propylene glycol monomethyl ether acetate, acetonitrile, dimethylformamide and dimethylsulfoxide. Preferred polar aprotic solvents are butyl acetate, cyclopentanone and propylene glycol monomethyl ether acetate, in particular cyclopentanone and propylene glycol monomethyl ether acetate.

Preferably, the composition of the present invention is a solution and comprises
i) 0.1 to 500 mg of the at least one polymer based on 1000 mg of the composition,
ii) 0.1 to 20% by weight of the at least one crosslinking agent carrying at least two azide groups based on the weight of the one or more polymers, and
iii) a solvent.

More preferably, the composition of the present invention is a solution and comprises
i) 0.1 to 250 mg of the at least one polymer based on 1000 mg of the composition,
ii) 0.1 to 15% by weight of the at least one crosslinking agent carrying at least two azide groups based on the weight of the one or more polymers, and
iii) a solvent.

Most preferably, the composition of the present invention is a solution and comprises
i) 10 to 100 mg of the at least one polymer based on 1000 mg of the composition,
ii) 1 to 10% by weight of the at least one crosslinking agent carrying at least two azide groups based on the weight of the one or more polymers, and
iii) a solvent.

The composition of the present invention can be prepared by mixing the at least one polymer consisting of one polymerblock A and at least two polymerblocks B, the at least one crosslinking agent carrying at least two azide groups, and optionally the solvent.

Also part of the present invention is a cured layer formed from the composition of the present invention.

The cured layer of the present invention is formed by applying the composition of the present invention to a suitable substrate or layer of a precursor of an electronic device, followed by an optional heat treatment and then by UV radiation treatment in order to cure the layer.

The electronic device can be a field-effect transistor, a capacitor, a light emitting diode, a photovoltaic device, a sensing device or a radio-frequency identification (RFID) tag. The precursor of the electronic device can be the substrate or the substrate covered by the source/drain electrodes and the semiconducting layer.

Preferably, the electronic device is a field-effect transistor, more preferably an organic field effect transistor. An organic field effect transistor is a field effect transistor, where the semiconducting layer comprises an organic semiconducting material.

The composition can be applied to a suitable substrate or layer of a precursor of an electronic device by techniques known in the art. Preferably, the composition is applied by liquid processing techniques such as spin coating, blading, slot-die coating, drop-casting, spray-coating, ink-jetting or soaking of the substrate of the electronic device in the composition. Preferably, the composition is applied by spin-coating.

The optional heat treatment can be performed at a temperature from 40 to 120° C., preferably at a temperature from 70 to 100° C.

The UV radiation treatment is preferably performed at a low dosage such as at 5 to 300 mJ/cm², more preferably at 50 to 150 mJ/cm². Preferably, the UV radiation is performed under ambient conditions. Ambient conditions refer to regular air, humidity and temperature conditions. Preferably, the UV radiation is of 365 nm.

The layer of the present invention can function as a dielectric layer, a resist layer, an insulating layer, a passivation layer, a planarization layer, an encapsulation layer or a coating layer. Preferably, the layer formed from the composition of the present invention is a dielectric layer.

Also part of the invention is an electronic device comprising the cured layer of the present invention.

The electronic device can be a field-effect transistor, a capacitor, a light emitting diode, a photovoltaic device, a sensing device or a radio-frequency identification (RFID) tag.

Preferably, the electronic device is a field-effect transistor, more preferably an organic field effect transistor. An organic field effect transistor is a field effect transistor, where the semiconducting layer comprises an organic semiconducting material.

More preferably, the electronic device is an organic field effect transistor and the layer of the present invention is the dielectric layer.

Usually, an organic field effect transistor comprises a dielectric layer, a semiconducting layer, a substrate, a gate electrode and source/drain electrodes.

The dielectric layer can have a thickness of 10 to 2000 nm, preferably of 50 to 1000 nm, more preferably of 100 to 800 nm. If the dielectric layer is formed from the composition of the present invention, the dielectric layer usually has a thickness of 100 to 1000 nm, preferably from 200 to 800 nm, more preferably from 300 to 600 nm.

The semiconducting layer comprises an organic semiconducting material. Examples of organic semiconducting materials are polythiophenes such as poly(3-hexylthiophene) (P3HT), polyfluorenes, polydiacetylene, poly(2,5- thienylene vinylene), poly(p-phenylene vinylene) (PPV) and polymers comprising repeating units having a diketopyrrolopyrrole group (DPP polymers).

Examples of DPP polymers and their synthesis are, for example, described in EP1078970, WO 2005/049695, WO 2008/000664, WO 2010/049321, WO 2010/049323, WO 2010/108873, WO 2010/115767, WO 2010/136353 and WO 2010/136352.

Preferably, the semiconducting material is a polymer comprising units having a diketopyrrolopyrrole group (DPP polymer).

Preferably, the semiconducting layer can have a thickness of 5 to 500 nm, preferably of 10 to 100 nm, more preferably of 20 to 50 nm.

The source/drain electrodes can be made from any suitable organic or inorganic source/drain material. Examples of inorganic source/drain materials are gold (Au), silver (Ag), chromium (Cr) or copper (Cu), as well as alloys comprising at least one of these metals. The source/drain electrodes can have a thickness of 1 to 100 nm, preferably from 20 to 70 nm.

The gate electrode can be made from any suitable gate material such as highly doped silicon, aluminium (Al), tungsten (W), indium tin oxide or gold (Au), or alloys comprising at least one of these metals. The gate electrode can have a thickness of 1 to 200 nm, preferably from 5 to 100 nm.

The substrate can be any suitable substrate such as glass, or a plastic substrate such as polyethersulfone, polycarbonate, polysulfone, polyethylene terephthalate (PET) and polyethylene naphthalate (PEN). Depending on the design of the organic field effect transistor, the gate electrode, for example highly doped silicon can also function as substrate.

The channel width (W) of the organic field effect transistor is typically in the range of 10 to 2000 μm and the channel length (L) of the organic field effect transistor is typically in the range of 5 to 100 μm.

The precursor of the electronic device can be any suitable precursor. If the electronic device is an organic field effect transistor, the precursor can be the substrate with the gate, or the substrate with the source/drain electrodes and the semiconducting layer.

If the electronic device is an organic field-effect transistor, and the layer of the present invention is the dielectric layer, the organic field effect transistor can be, for example, prepared as follows:

The source and drain electrodes can be formed by lithographically patterning a suitable source/drain material, for example gold, on a suitable substrate, for example PET. The source/drain electrodes can then be covered with a semiconducting layer by spin-coating a solution of a semiconducting material, for example a DPP polymer, in a suitable solvent, for example toluene, on the substrate. The wet semiconducting layer can be heated. The semiconducting layer can then be covered with a dielectric layer by spin-coating the composition of the present invention on the semiconducting layer, followed by heat treatment and UV radiation treatment. The gate electrode can then be deposited on the dielectric layer for example by vapour deposition of a suitable source/drain material, for example gold.

Also part of the present invention are polymers consisting of one polymerblock A and two polymerblocks B, wherein each polymerblock B is attached to the polymerblock A, and wherein at least 60 mol % of the monomer units of polymerblock B are selected from the group consisting of

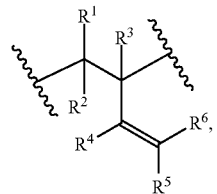
(1A)

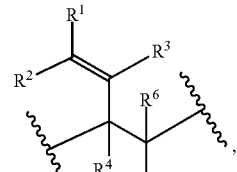
(1B)

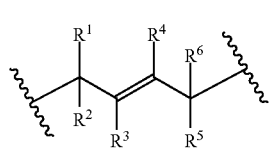
(1C)

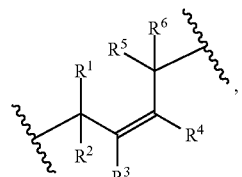
(1D)

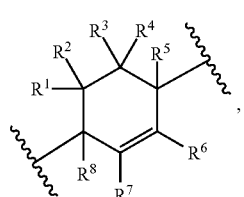
(1E)

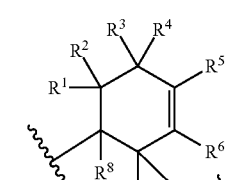
(1F)

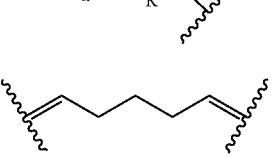
(1G)

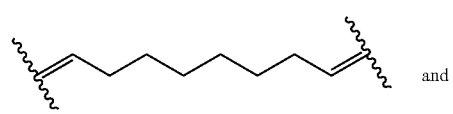
(1H)
and

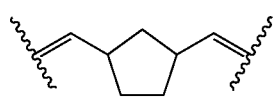
(1I)

wherein $R^1$, $R^2$, $R^3$, $R^4$, $R^5$, $R^6$, $R^7$ and $R^8$ are independently and at each occurrence H or $C_{1-4}$-alkyl, with the proviso that at least one of the monomer units (1A) and (1B) is present, and that the ratio of [mols of monomer units (1A) and (1B)]/[mols of monomer units (1A), (1B), (1C) and (1D)] is at least 30%.

Preferably, at least 70 mol % of the monomer units of the polymerblock B of the polymers of the present invention are selected from the group consisting of

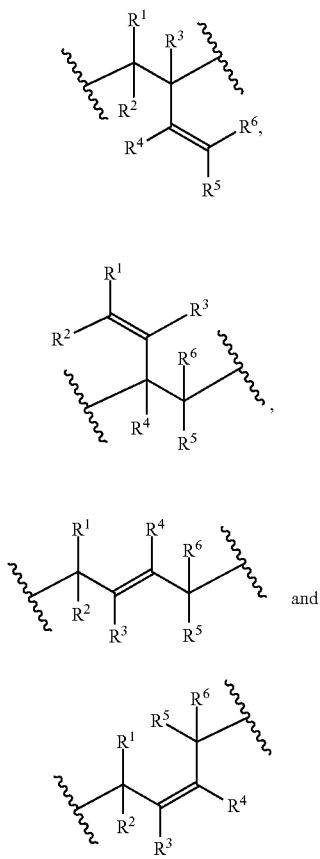

wherein $R^1$, $R^2$, $R^3$, $R^4$, $R^5$ and $R^6$ are independently and at each occurrence H or $C_{1-4}$-alkyl, with the proviso that at least one of the monomer units (1A) and (1B) is present, and that the ratio of [mols of monomer units (1A) and (1B)]/[mols of monomer units (1A), (1B), (1C) and (10)] is at least 50%.

More preferably, at least 80 mol % of the monomer units of the polymerblock B of the polymers of the present invention are selected from the group consisting of

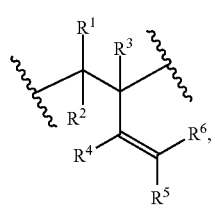
(1A)

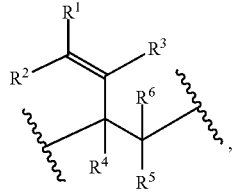

wherein $R^1$, $R^2$, $R^3$, $R^4$, $R^5$ and $R^6$ are H, with the proviso that at least one of the monomer units (1A) and (1B) is present, and that the ratio of [mols of monomer units (1A) and (1B)]/[mols of monomer units (1A), (1B), (1C) and (1D)] is at least 70%.

The polymerblock B of the polymers of the present invention can contain further monomer units, such as monomer units (4A), (4C), (4D), (4E) or (4F). However, most preferred, polymerblock B essentially consists of monomer units selected from the group consisting of (1A), (1B), (1C), (1D), (1E), (1F), (1G), (1H) and (1I).

Preferably, at least 80 mol % of the monomer units of polymerblock A of the polymers of the present invention are selected from the group consisting of

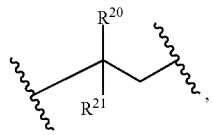
(4A)

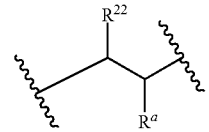
(4C)

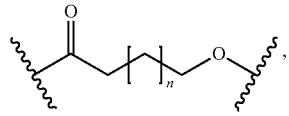
(4D)

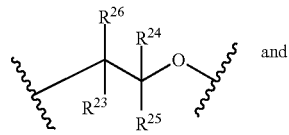
(4E)

-continued

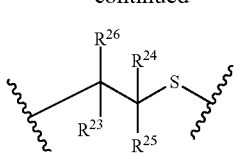
(4F)

wherein $R^{20}$, $R^{21}$, $R^{22}$, $R^{23}$, $R^{24}$, $R^{25}$ and $R^{26}$ are independently and at each occurrence selected from the group consisting of H, $C_{6-14}$-aryl, 5 to 14 membered heteroaryl and $C_{1-30}$-alkyl, and $R^a$ is C(O)OH, C(O)O$C_{1-30}$-alkyl, C(O)—H, C(O)$C_{6-14}$-aryl, C(O)N($C_{1-30}$-alkyl)$_2$, C(O)N($C_{6-14}$-aryl)$_2$, C(O)N($C_{1-30}$-alkyl)($C_{6-14}$-aryl), C(O)—$C_{6-14}$-aryl, C(O)—$C_{1-30}$-alkyl, O—$C_{6-14}$-aryl, O—$C_{1-30}$-alkyl, OC(O)$C_{1-30}$-alkyl, OC(O)$C_{6-14}$-aryl or CN, wherein $C_{6-14}$-aryl and 5-14 membered heteroaryl can be substituted with one or more substituents selected from the group consisting of $C_{1-10}$-alkyl, C(O)OH, C(O)O$C_{1-10}$-alkyl, C(O)phenyl, C(O)N($C_{1-10}$-alkyl)$_2$, C(O)N(phenyl)$_2$, C(O)N($C_{1-10}$-alkyl)(phenyl), C(O)-phenyl, C(O)—$C_{1-10}$-alkyl, OH, O-phenyl, O—$C_{1-10}$-alkyl, OC(O)$C_{1-10}$-alkyl, OC(O)-phenyl and CN and NO$_2$, and $C_{1-30}$-alkyl can be substituted with one or more substituents selected from the group consisting of with phenyl, C(O)OH, C(O)O$C_{1-10}$-alkyl, C(O)phenyl, C(O)N($C_{1-10}$-alkyl)$_2$, C(O)N(phenyl)$_2$, C(O)N($C_{1-10}$-alkyl)(phenyl), C(O)-phenyl, C(O)—$C_{1-10}$-alkyl, O-phenyl, O—$C_{1-10}$-alkyl, OC(O)$C_{1-10}$-alkyl, OC(O)-phenyl, Si($C_{1-10}$-alkyl)$_3$, Si(phenyl)$_3$ and CN and NO$_2$, n is an integer from 1 to 3.

More preferably, at least 80 mol % of the monomer units of polymerblock A of the polymers of the present invention are selected from the group consisting of

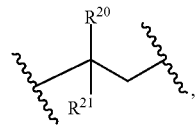
(4A)

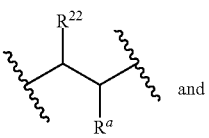
(4C)

and

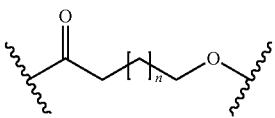
(4D)

wherein $R^{20}$, $R^{21}$ and $R^{22}$ are independently selected from the group consisting of H, $C_{6-14}$-aryl, 5 to 14 membered heteroaryl and $C_{1-30}$-alkyl, and $R^a$ is C(O)O$C_{1-30}$-alkyl, wherein $C_{6-14}$-aryl and 5-14 membered heteroaryl can be substituted with one or more $C_{1-10}$-alkyl, and $C_{1-30}$-alkyl can be substituted with one or more substituents selected from the group consisting of Si($C_{1-10}$-alkyl)$_3$ and Si(phenyl)$_3$, and n is an integer from 1 to 3.

Most preferably, at least 80 mol % of the monomer units of polymerblock A of the polymers of the present invention is a monomer unit selected from the group consisting of

(4A)

wherein $R^{20}$ and $R^{21}$ are independently selected from the group consisting of H and $C_{6-14}$-aryl, wherein $C_{6-14}$-aryl can be substituted with one or more $C_{1-10}$-alkyl.

The polymerblock A of the polymers of the present invention can additionally contain further monomer units, such as the monomer units (1A), (1B), (1C), (1D), (1E), (1F), (1G), (1H) and (1I). However, most preferred, polymerblock A of the polymers of the present invention essentially consists of monomer units selected from the group consisting of (4A), (4C), (4D), (4E) and (4F).

Preferably, the polymer of the present is a polymer consisting of one polymerblock A and two polymerblocks B, a so-called "triblock polymer", wherein at least 70 mol % of the monomer units of the polymerblock B are selected from the group consisting of

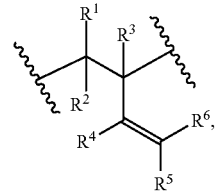
(1A)

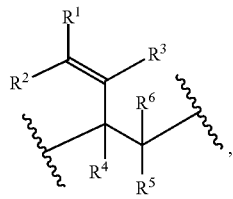
(1B)

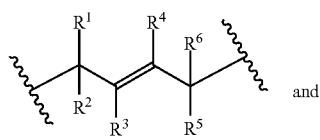
(1C)

and

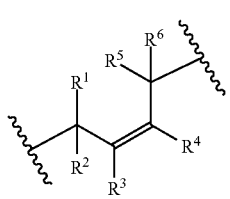
(1D)

wherein
$R^1$, $R^2$, $R^3$, $R^4$, $R^5$ and $R^6$ are independently and at each occurrence H or $C_{1-4}$-alkyl, with the proviso that at least one of the monomer units 1A and 1B is present, and that the ratio of [mols of monomer units 1A and 1B]/[mols of monomer units 1A, 1B, 1C and 1D] is at least 50%, and at least 80 mol % of the monomer units of polymerblock A is a monomer unit of formula

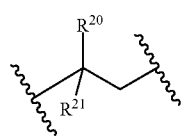
(4A)

wherein
$R^{20}$ is H, and
$R^{21}$ is at each occurrence $C_{6-14}$-aryl,
wherein
$C_{6-14}$-aryl can be substituted with one or more $C_{1-10}$-alkyl.

More preferably, the polymer of the present invention is a polymer consisting of one polymerblock A and two polymerblocks B, a so-called "triblock polymer", wherein at least 80 mol % of the monomer units of the polymerblock B are selected from the group consisting of

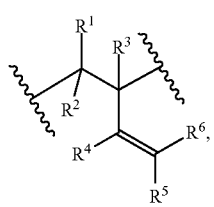
(1A)

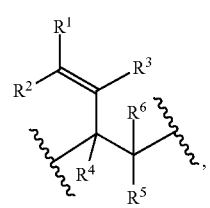
(1B)

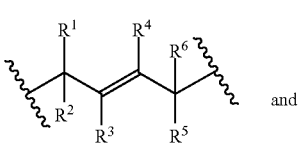
(1C)
and

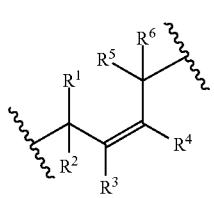
(1D)

wherein
$R^1$, $R^2$, $R^3$, $R^4$, $R^5$ and $R^6$ are H,
with the proviso that at least one of the monomer units 1A and 1B is present, and that the ratio of [mols of monomer units 1A and 1B]/[mols of monomer units 1A, 1B, 1C and 1D] is at least 70%, and at least 90 mol % of the monomer units of polymerblock A is a monomer unit of formula

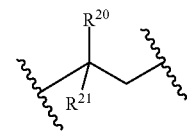
(4A)

wherein
$R^{20}$ is H and, $R^{21}$ is phenyl.

The following definitions and preparation methods regarding polymers, including definitions and preparation methods regarding polymerblock B and polymerblock A, apply to the polymers of the present invention as well as to the polymers of the composition of the present invention.

Preferably, the weight ratio of polymerblock A/total polymerblocks B is from 60/40 to 96/4. More preferably, the weight ratio of polymerblock A/total polymerblocks B is from 70/30 to 96/4. Most preferably, the weight ratio of polymerblock A/total polymerblocks B is from 76/24 to 94/4.

Preferably, the polymers have a number average molecular weight Mn of at least 60000 g/mol and a weight average molecular weight Mw of at least 70000 g/mol, both as determined by gel permeation chromatography.

More preferably, the polymers have a number average molecular weight Mn of at least 100000 g/mol and a weight average molecular weight Mw of at least 120000 g/mol, both as determined by gel permeation chromatography.

Most preferably, the polymers have a number average molecular weight Mn of at least 120000 g/mol and a weight average molecular weight Mw of at least 150000 g/mol, both as determined by gel permeation chromatography.

It is assumed that the total monomers used in the preparation of polymerblock B are incorporated in polymerblock B.

It is assumed that mol % of the monomer units (1A), (1B), (1C) and (1D) is equal to mol % of monomer

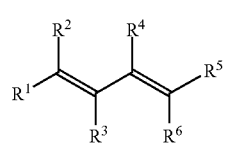
(5A)

wherein $R^1$, $R^2$, $R^3$, $R^4$, $R^5$ and $R^6$ are as defined for monomer units (1A), (1B), (1C) and (1D), based on total mols of monomers used in the preparation of polymerblock B.

The ratio of [mols of monomer units (1A) and (1B)]/[mols monomer units (1C) and (1D)] can be determined from the integrated signals obtained by $^1$H-NMR allowing sufficient time for full relaxation of the signals. From this data, the ratio of [mols of monomer units (1A) and (1B)]/[mols of monomer units (1A), (1B), (1C) and (1D)] can be calculated.

It is assumed that mol % of the monomer units (1E) and (1F) in polymerblock B is equal to mol % of monomer

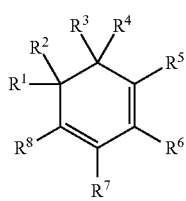

(5B)

wherein $R^1$, $R^2$, $R^3$, $R^4$, $R^5$, $R^6$, $R^7$ and $R^8$ are as defined for monomer units (1E) and (1F), based on total mols of monomers used in the preparation of polymerblock B.

It is assumed that mol % of the monomer units (1G) in polymerblock B is equal to mol % of monomer

(5C)

based on total mols of monomers used in the preparation of polymerblock B.

It is assumed that mol % of the monomer units (1H) in polymerblock B is equal to mol % of monomer

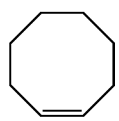

(5D)

based on total mols of monomers used in the preparation of polymerblock B.

It is assumed that mol % of the monomer units (1I) in polymerblock B is equal to mol % of monomer

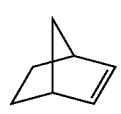

(5E)

based on total mols of monomers used in the preparation of polymerblock B.

It is assumed that all monomers used in the preparation of polymerblock A are incorporated in polymerblock A.

Thus, it is assumed that mol % of the monomer units (4A) in polymerblock A is equal to mol % of monomer

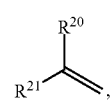

(6A)

wherein $R^{20}$ and $R^{21}$ are as defined for monomer unit (4A), based on the total mols of monomers used in the preparation of polymerblock A.

It is assumed that mol % of the monomer units (4B) in polymerblock A is equal to the mol % of monomer

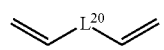

(6B)

wherein $L^{20}$ is as defined for monomer units (4B), based on the total mols of monomers used in the preparation of polymerblock A.

It is assumed that mol % of the monomer units (4C) in polymerblock A is equal to the mol % of monomer

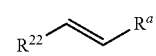

(6C)

wherein $R^{22}$ and $R^a$ are is as defined for monomer unit (4C), based on the total mols of monomers used in the preparation of polymerblock A.

It is assumed that mol % of the monomer units (4D) in polymerblock A is equal to the mol % of monomer

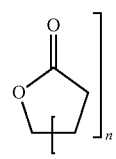

(6D)

wherein n is as defined for monomer unit (4D), based on the total mols of monomers used in the preparation of polymerblock A.

It is assumed that mol % of the monomer units (4E) in polymerblock A is equal to the mol % of monomer

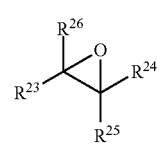

(6E)

wherein $R^{23}$, $R^{24}$, $R^{25}$ and $R^{26}$, are as defined for monomer unit (4E), based on the total mols of monomers used in the preparation of polymerblock A.

It is assumed that mol % of the monomer units (4F) in polymerblock A is equal to the mol % of monomer

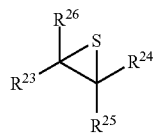

(6F)

wherein
$R^{23}$, $R^{24}$, $R^{25}$ and $R^{26}$ are as defined for monomer unit (4F),
based on the total mols of monomers used in the preparation of polymerblock A.

The polymer consisting of one polymerblock A and at least two polymerblocks B can be prepared by polymerisation methods known in the art.

For example, polymerblock A can be prepared by anionic polymerisation methods using at least 80 mol % of monomers selected from the group consisting of

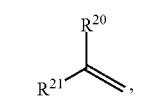

(6A)

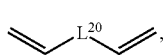

(6B)

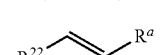

(6C)

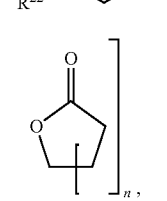

(6D)

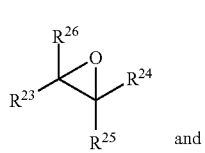

(6E)

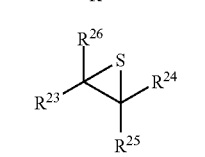

and (6F)

wherein
$R^1$, $R^2$, $R^3$, $R^4$, $R^5$, $R^6$, $R^7$ and $R^8$ are as defined for monomer units (4A), (4B), (4C), (4D), (4E) and (4F),
based on total mols of monomers used in the preparation of polymerblock A.

For example, polymerblock B can be prepared by anionic polymerisation methods using at least 60 mol % of monomers selected from the group consisting of

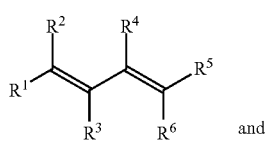

and (5A)

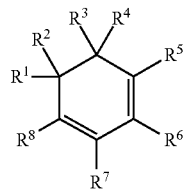

(5B)

wherein
$R^1$, $R^2$, $R^3$, $R^4$, $R^5$, $R^6$, $R^7$ and $R^8$ are as defined for monomer units (1A), (1B), (1C) and (1D),
based on total mols of monomers used in the preparation of polymerblock B.

The anionic polymerisation methods are usually initiated by a mono-functional initiator such as n-BuLi or sec-BuLi, or a bi-functional initiator such as 1,4-dilithio-1,1,4,4-tetraphenylbutane.

The anionic polymerisation methods are usually performed in a suitable aprotic solvent or mixture of aprotic solvents. The aprotic solvent can be a polar solvent such as tetrahydrofuran or a non-polar solvent such as toluene or cyclohexane.

The weight ratio of total monomer/solvent is usually in the range of 1/100 to 40/100 (weight/weight), more preferably in the range of 5/10 to 30/100 (weight/weight).

The anionic polymerisations are usually performed at a temperature from 30 to 80° C., preferably 50 to 80° C.

The anionic polymerisations are usually terminated by addition of a protic solvent such as water or isopropanol.

Practical details of performing anionic polymerizations are described e.g. by Maurice Morton in "Anionic Polymerization: Principles and Practice", Academic Press, New York, 1983, and by Henry Hsieh, Roderic P. Quirk Anionic Polymerization: Principles and Practical Applications, Marcel Dekker, New York, 1996.

For example, polymerbock B can be prepared by ring-opening metathesis polymerisation (ROMP) using at least 60 mol % of monomers selected from the group consisting of

(5C)

and (5D)

(5E)

based on total mols of monomers used in the preparation of polymerblock B.

The ring-opening metathesis polymerisation methods are usually performed in the presence of a suitable catalyst such Schrock catalyst or Grubbs' catalyst. The ring-opening metathesis polymerisation methods can be terminated by addition of an aldehyde.

Proper selection of the catalyst and performing ROMP can be taken from the "Handbook of Metathesis, Volume 1-3" by Robert H. Grubbs et at. 2015, Wiley-VCH, Weinheim, and Robert H. Grubbs in Handbook of Metathesis (Wiley-VCH, Weinheim, 2003).

If the polymer is a polymer consisting of one polymerblock A and two polymerblocks B, a so-called "triblock polymer", the following preparation methods may be used: "sequential addition of monomers", "bifunctional initiation" or "bifunctional coupling".

"Sequential addition of monomers" by anionic polymerisation can involve providing a mono-functional initiator, such as n-BuLi or sec-BuLi, followed by addition of the monomers for the first polymerblock B, followed by addition of the monomers for the polymerblock A, followed by addition of the monomers for the second polymerblock B, followed by termination with a protic solvent.

"Bifunctional initiation" by anionic polymerisation can involve providing a bifunctional initiator such as 1,4-dilithio-1,1,4,4-tetraphenylbutane, followed by addition of the monomers of polymerblock A, followed by addition of the monomers of polymerblocks B, followed by termination with a protic solvent. In the final polymer, the bifunctional initiator becomes part of polymerblock A.

"Bifunctional coupling" can involve coupling of polymerblock A carrying two terminal CH=O groups with polymerblock B prepared either by anionic polymerisation using a mono-functional initiator or by ring-opening metathesis polymerisation (ROMP).

"Bifunctional coupling" can also involve coupling of polymerblock A prepared by anionic polymerisation using a bifunctional initiator with polymerblock B carrying a CH=O group.

Polymerblock A carrying two terminal CH=O groups can be prepared by anionic polymerisation using a bifunctional initiator, followed by termination with a reagent containing a group causing the termination and in addition an aldehyde group or protected aldehyde group, and, if a protected aldehyde group is present, deprotecting the protected aldehyde group.

Polymerblock B carrying a CH=O group can be prepared either by anionic polymerisation using a monofunctional initiator or by ring-opening metathesis polymerisation (ROMP), both followed by termination with a reagent containing a group causing the termination and in addition an aldehyde group or protected aldehyde group, and, if a protected aldehyde group is present, deprotecting the protected aldehyde group.

Examples of reagents containing a group causing the termination and in addition an aldehyde group are O=CH—($CH_2$)$_2$—Cl, O=CH-phenylene-$CH_2$Cl and O=CH—$CH_2$-Si(Me)$_2$Cl.

Examples of reagents containing a group causing the termination and in addition a protected aldehyde group are O=CH—($CH_2$)$_2$—C($OCH_3$)$_2$ or O=CH-phenylene-C($OCH_3$)$_2$. The protected aldehyde group can be deprotected by hydrolysis in the presence of acetic acid.

A comprehensive overview for making end-functionalized polymers by protected functionalized termination agents and initiators are given by A. Hirao and M. Hayashi in "Recent advance in syntheses and applications of well-defined end functionalized polymers by means of anionic living polymerization", Acta Polymerica 1999, Vol. 50, page 219 to 231.

If the polymer is a polymer consisting of one polymerblock A and more than two polymerblocks B, a so-called "star-shaped polymer", the following preparation methods may be used: "multifunctional initiation" or "multifunctional coupling".

For example, "multifunctional initiation" by anionic polymerisation can involve providing a multifunctional initiator, followed by addition of the monomers of polymerblock A, followed by addition of the monomers of polymerblocks B. In the final polymer, the multifunctional initiator becomes part of polymerblock A. If, for example, polymerblock A mainly contains mainly monomer units of formula (1A), the multifunctional initiator can be an oligomer obtained by polymerisation of divinylbenzene, diphenylethylene and styrene in the presence of a mono-functional initiator, usually a lithium organic compound such as n-BuLi or sec-BuLi.

For example, "Multifunctional coupling" by anionic polymerisation can involve providing a mono-functional initiator, usually a lithium organic compound such as n-BuLi or sec-BuLi, followed by addition of the monomers for the polymerblocks B, followed by addition of the monomers of polymerblock A, followed by addition of a multifunctional coupling agent such as 1,2-bis-(trichlorosilyl)ethane.

Depending on the monomer units of polymerblock A and polymerblock B, a suitable preparation method can be chosen.

The composition of the present invention is advantageous as it is a composition comprising a) at least one polymer suitable for use as dielectric material and b) at least one crosslinking agent carrying at least two azide groups, and wherein the polymer shows improved crosslinkability regarding the crosslinking agent at low-dosage UV radiation (5 to 300 mJ/m$^2$) under ambient conditions. Ambient conditions refer to ambient air, humidity and temperature conditions. Thus, the compositions of the present invention do not require inert gas atmosphere in order to be cured at low-dosage UV radiation under ambient conditions.

A high crosslinkability is characterized by a high film retention ratio d2/d1 of the crosslinked layer formed from the composition of the present invention. In the film retention ratio, d1 is the thickness of the layer formed from the composition of the present invention after cross-linking and before development and d2 is the thickness of the layer formed from the composition of the present invention after crosslinking and after development.

The inventive cured layer formed from the composition of the present invention is highly stable towards solvent dissolution. Thus, the next layer, for example an electrode material layer or barrier layer, can be applied without dissolving the inventive cured layer. The high crosslinkability of the polymer regarding the crosslinking agent carrying at least two azide groups also allows the structuring (patterning) of the inventive layer using a photo-mask.

Depending on the crosslinking agent carrying at least two azide groups, UV radiation of 365 nm can be used.

The polymers of the present invention are embraced by the polymers of the composition of the present invention, and show a high crosslinkability of the polymer regarding the cross-linking agent carrying at least two azide groups. Polymers of the present invention having a number average molecular weight Mn of at least 120000 g/mol and a weight average molecular weight Mw of at least 150000 g/mol, both as determined by gel permeation chromatography, show a particular high crosslinkability.

Polymers of the present invention, wherein i) at least 70 mol % of the monomer units of the polymerblock B are selected from the group consisting of

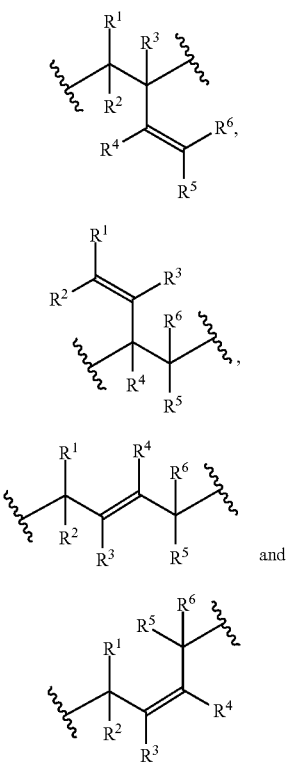

wherein

R¹, R², R³, R⁴, R⁵ and R⁶ are independently and at each occurrence H or $C_{1-4}$-alkyl, with the proviso that at least one of the monomer units (1A) and (1B) is present, and that the ratio of [mols of monomer units (1A) and (1B)]/[mols of monomer units (1A), (1B), (1C) and (1D)] is at least 50%, and ii) at least 80 mol % of the monomer units of polymer-block A is a monomer unit of formula

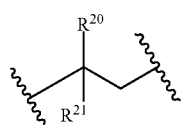

(4A)

wherein

R²⁰ and R²¹ are independently selected from the group consisting of H and $C_{6-14}$-aryl, wherein $C_{6-14}$-aryl can be substituted with one or more $C_{1-10}$-alkyl, are particular advantageous, because the polymers can be prepared by "sequential addition of monomer" polymerization, which is technically very convenient.

EXAMPLES

Example 1

Figure 1:
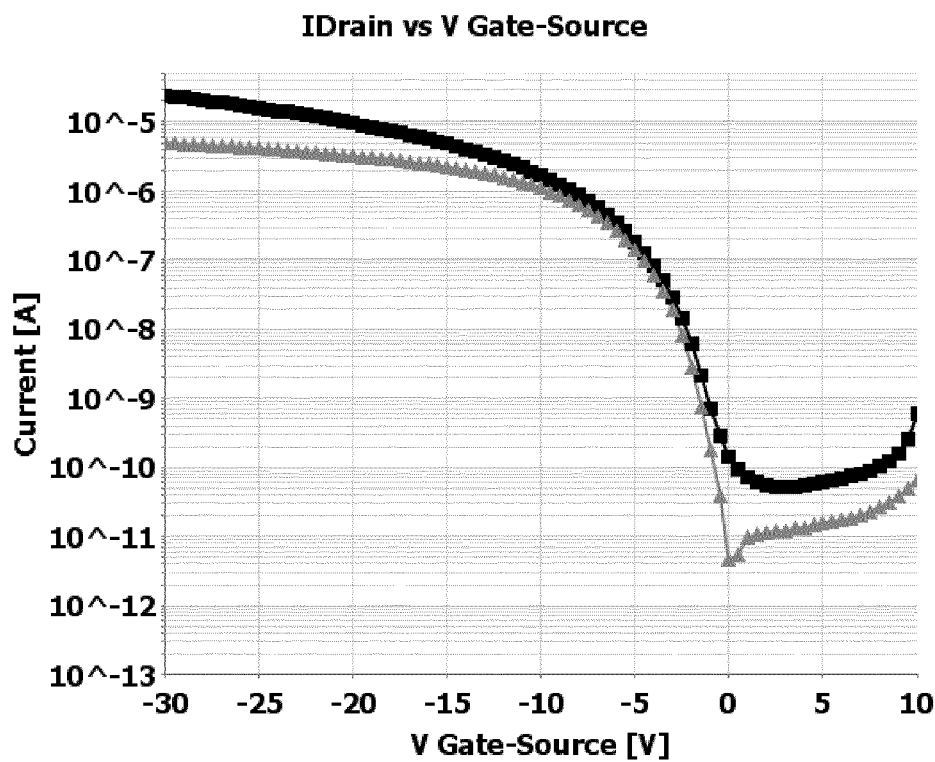
FIG. 1 shows the drain current $I_{ds}$ in relation to the gate voltage $V_{gs}$ (transfer curve) for the top-gate field effect transistor at a source voltage $V_{ds}$ of −5V (triangle), respectively, −30V (square) for the a top-gate field effect transistor comprising a dielectric layer formed from polymer Pa.

Preparation of a star-shaped polymer Pa having a styrene based-inner block and butadiene-based outer blocks First Step: Preparation of a Multifunctional Initiator Oligomer In a 10 L stainless steel reactor equipped with a cross-bar stirrer, 2244 mL cyclohexane and 223.1 g (1239 mmol) 1,1-diphenylethylene (DPE) were heated to 60° C. and titrated with s-BuLi (1.4 M in cyclohexane) until a stable orange-red color remained. Then, 13.4 ml (18.76 mmol) s-BuLi (1.4 M in cyclohexane) was added to the reaction mixture and the reaction mixture was stirred for 30 min. Then, 2.94 mL (18.62 mmol) divinylbenzene (80%, Aldrich technical grade) was added to the reaction mixture and the reaction mixture was stirred for 10 min. Then 10 mL (87 mmol) styrene was added and the reaction mixture was stirred for further 10 min.

Second Step: Preparation of a Star-Shaped Polymer from the Multifunctional Initiator Oligomer 310.8 g (2988 mmol) styrene was added to the reaction mixture of the first step and the reaction mixture was stirred for 30 min. Then, 103.6 g (996 mmol) styrene were added and the reaction mixture was stirred for further 30 min. 172 mL (112.5 g, 2009 mmol) butadiene was added to the reaction mixture and the reaction mixture was stirred at 70° C. for 30 min. The reaction mixture was quenched with 1.5 mL isopropanol and acidified with 1.5 mL acetic acid. To the colorless reaction mixture 1500 mL toluene was added and then cyclohexane was removed at the rotavap. The remaining reaction mixture was decanted from some gel particles, filtered over a G4 fritte and then precipitated into isopropanol while stirring with a Ultraturrax. The white precipitate was filtered off and washed 10 times with 300 mL isopropanol each. The polymer was then re-dissolved in 500 mL dry toluene and filtered over a 29 mm column filled with a layer of 15 cm dried silicagel and 5 cm kieselgur, followed by washing of the column with toluene until the wash-solution was polymer-free. The combined solutions were concentrated at the rotavap to 600 mL and precipitated into 6000 mL isopropanol while stirring with an Ultraturrax, the white precipitate was filtrated and washed 10 times with 300 isopropanol each and finally dried at 90° C. under vacuum. The polymer Pa was obtained as white powder. Mn=76000 g/mol. Mw=152000 g/mol (as determined by gel-permeation chromatography with polystyrene standards). PDI 2.0. Tg=−102 and 125° C. Amount of 1,2-addition of butadiene in the polybutadiene blocks=9% and amount of 1,4-addition of butadiene in the polybutadiene blocks=91% (as determined by ¹H-NMR) based on the total amount of butadiene in the polybutadiene block.

Example 2

Preparation of triblock polymer Pb comprising a styrene-based inner block and butadiene-based outer blocks with a mass ratio styrene:butadiene of 90:10 and an amount of 1,2-addition of butadiene in the polybutadiene blocks of 73% based on the total amount of butadiene in the polybutadiene block In a 10 L stainless steel reactor equipped with a cross-bar stirrer, 4872 ml (3800 g) cyclohexane, 256 mL (200 g) THF and 1 g 1,1-diphenylethylene (DPE) were heated to 30° C. and titrated with s-BuLi (1.4 M in cyclohexane) until a stable orange-red color remained (ca. 1.8 ml). Then, 7.14 mL s-BuLi (1.4 M in cyclohexane) was added to the reaction mixture and immediately 76 mL (50 g) butadiene were added under stirring. The temperature was kept at 60° C. controlled by the reactor jacket temperature after 20 min 990 mL (900 g) styrene was added slowly to keep the temperature at 50° C. by jacket counter-cooling. After 25 min another 76 mL (50 g) butadiene were added. After 20 min 1.15 mL isopropanol was added and further stirred for 10 min. The colorless solution was transferred into two 5 Liter canisters and shaken together with 25 mL water and 50 g dry ice each for purpose of acidification.

Workup

The acidified mixture (solid content 20%) was precipitated into ethanol (10 fold volume containing 0.1% Kerobit TBK with respect to polymer), washed 3 times with 5 L ethanol and 3 times with 1 L distilled water on a Büchi funnel. Finally, the white powder was washed two times with 2.5 L ethanol and four times with 250 mL ethanol and finally dried at 50° C. under vacuum for 24 h. The obtained white powder, triblock polymer Pc, had the following characteristics: Mn=220000 g/mol. Mw=330000 g/mol (as determined by gel-permeation chromatography with polystyrene standards). PDI 1.5. Amount of 1,2-addition of butadiene in the polybutadiene blocks=73% (as determined by $^1$H-NMR) based on the total amount of butadiene in the polybutadiene block.

Example 3

Preparation of triblock polymer Pc comprising a styrene-based inner block and butadiene-based outer blocks with a mass ratio styrene:butadiene of 85:15 and an amount of 1,2-addition of butadiene in the polybutadiene blocks of 73% based on the total amount of butadiene in the polybutadiene block In a 10 L stainless steel reactor equipped with a cross-bar stirrer, 4872 mL (3800 g) cyclohexane, 256 ml (200 g) THF and 1 g 1,1-diphenylethylene (DPE) were heated to 30° C. and titrated with s-BuLi (1.4 M in cyclohexane) until a stable orange-red color remained (ca. 1.8 mL). Then, 7.14 mL s-BuLi (1.4 M in cyclohexane) was added to the reaction mixture and immediately 115 mL (75 g) butadiene were added under stirring. The temperature was kept at 60° C. controlled by the reactor jacket temperature after 20 min 935 mL (850 g) styrene was added slowly to keep the temperature at 50° C. by jacket counter-cooling. After 25 min another 115 mL (75 g) butadiene were added. After 20 min 1.15 mL isopropanol was added and further stirred for 10 min. The colorless solution was transferred into two 5 L canisters and shaken together with 25 mL water and 50 g dry ice each for purpose of acidification.

Workup

The acidified mixture (solid content 20%) was precipitated into ethanol (10 fold volume containing 0.1% Kerobit TBK with respect to polymer), washed 3 times with 5 L ethanol and 3 times with 1 L distilled water on a Büchi funnel. Finally, the white powder was washed two times with 2.5 L ethanol and four times with 250 mL ethanol and finally dried at 50° C. under vacuum for 24 h. The obtained white powder, triblock polymer Pc, had the following characteristics: Mn=140000 g/mol. Mw=170000 g/mol. PDI 1.2. Amount of 1,2-addition of butadiene in the polybutadiene blocks=73% (as determined by $^1$H-NMR) based on the total amount of butadiene in the polybutadiene block.

Example 4

Preparation of triblock polymer Pd comprising a styrene-based inner block and butadiene-based outer blocks with a mass ratio styrene:butadiene of 80:20 and an amount of 1,2-addition of butadiene in the polybutadiene blocks of 73% based on the total amount of butadiene in the polybutadiene block In a 10 L stainless steel reactor equipped with a cross-bar stirrer, 4872 mL (3800 g) cyclohexane, 256 mL (200 g) THF and 1 g 1,1-diphenylethylene (DPE) were heated to 30° C. and titrated with s-BuLi (1.4 M in cyclohexane) until a stable orange-red color remained (ca. 1.8 mL). Then, 7.14 mL s-BuLi (1.4 M in cyclohexane) was added to the reaction mixture and immediately 153 mL (100 g) butadiene were added under stirring. The temperature was kept at 60° C. controlled by the reactor jacket temperature after 20 min 880 mL (800 g) styrene was added slowly to keep the temperature at 50° C. by jacket counter-cooling. After 25 min another 153 mL (100 butadiene were added. After 20 min 1.15 mL isopropanol was added and further stirred for 10 min. The colorless solution was transferred into two 5 L canisters and shaken together with 25 mL water and 50 g dry ice each for purpose of acidification.

Workup

The acidified mixture (solid content 20%) was precipitated into ethanol (10 fold volume containing 0.1% Kerobit TBK with respect to polymer), washed 3 times with 5 L ethanol and 3 times with 1 L distilled water on a Büchi funnel. Finally, the white powder was washed two times with 2.5 L ethanol and four times with 250 ml ethanol and finally dried at 50° C. under vacuum for 24 h. The obtained white powder, triblock polymer Pd, had the following characteristics: Mn=68000 g/mol. Mw=78000 g/mol. PDI 1.15. Amount of 1,2-addition of butadiene in the polybutadiene blocks=73% (as determined by $^1$H-NMR) based on the total amount of butadiene in the polybutadiene block.

Example 5

Preparation of top-gate field effect transistors comprising a dielectric layer formed from polymer Pa of example 1, polymer Pb of example 2, polymer Pc of example 3, respectively, polymer Pd of example 4 in the presence of a crosslinker Gold was sputtered onto PET substrate to form approximately 40 nm thick gold source/drain electrodes. A 0.75% (weight/weight) solution of the diketopyrrolopyrrole semiconducting polymer of example 1 of WO 2013/083506 in toluene was filtered through a 0.45 micrometer polytetrafluoroethylene (PTFE) filter and then applied by spin coating (1,000 rpm, 30 seconds). The wet organic semiconducting layer was dried at 90° C. on a hot plate for 60 seconds. A solution of 80 mg/ml of polymer Pa, prepared as described in example 1, in mixture of propylene glycol monomethyl ether acetate (PGMEA) and cyclopentanone (CP) (70/30), containing 4% by weight of 2,7-bis[2-(4-azido-2,3,5,6-tetrafluoro-phenyl)ethynyl]-9,9-dihexyl-fluorene as crosslinker based on the weight of polymer Pa, was filtered through a 1 micrometer filter. The solution was spin-coated (1800 rpm, 30 seconds) on the semiconducting layer. The wet dielectric layer was pre-baked at 90° C. for 2 minutes and subsequently UV-cured by irradiating at 365 nm with a dosage of ~100 mJ/cm² under ambient conditions. Afterwards, the device was wetted with a solution of PGMEA/CP (70/30) for 1 minute to develop the dielectric and spin-coated dry at (2000 rpm, 1 min) followed by a post-bake of 15 minutes at 90° C. on a hot plate. Gate electrodes of gold (thickness approximately 80 nm) were evaporated through a shadow mask on the dielectric layer.

The same procedure as described for polymer Pa was used when preparing a top-gate field effect transistor using polymer Pb as dielectric, but 3% instead of 4% by weight of 2,7-bis[2-(4-azido-2,3,5,6-tetrafluoro-phenyl)ethynyl]-9,9-dihexyl-fluorene as crosslinker based on the weight of polymer Pb was used.

The same procedure as described for polymer Pa was used when preparing a top-gate field effect transistor using polymer Pc as dielectric.

The same procedure as described for polymer Pa was used when preparing a top-gate field effect transistor using polymer Pd as dielectric, but 6% instead of 4% by weight of 2,7-bis[2-(4-azido-2,3,5,6-tetrafluoro-phenyl)ethynyl]-9,9-dihexyl-fluorene as crosslinker based on the weight of polymer Pd was used.

The top gate field effect transistors were measured by using a Keithley 4200-SCS semiconductor characterization system.

The drain current $I_{ds}$ in relation to the gate voltage $V_{gs}$ (transfer curve) for the top-gate field effect transistor at a source voltage $V_{ds}$ of −5V (triangle), respectively, −30V (square) for the a top-gate, bottom-contact field effect transistor comprising a dielectric layer formed from polymer Pa is shown in FIG. 1.

Figure 2:
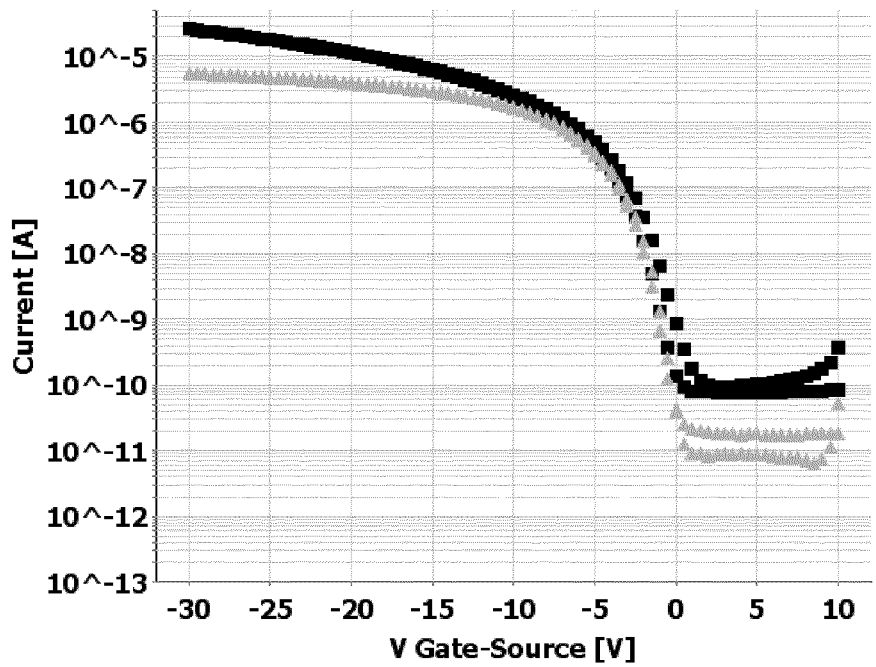
FIG. 2 shows the drain current $I_{ds}$ in relation to the gate voltage $V_{gs}$ (transfer curve) for the top-gate field effect transistor at a source voltage $V_{ds}$ of −5V (triangle), respectively, −30V (square) for the a top-gate field effect transistor comprising a dielectric layer formed from polymer Pb.

The drain current $I_{ds}$ in relation to the gate voltage $V_{gs}$ (transfer curve) for the top-gate field effect transistor at a source voltage $V_{ds}$ of −5V (triangle), respectively, −30V (square) for the a top-gate, bottom-contact field effect transistor comprising a dielectric layer formed from polymer Pb is shown in FIG. 2.

Figure 3:
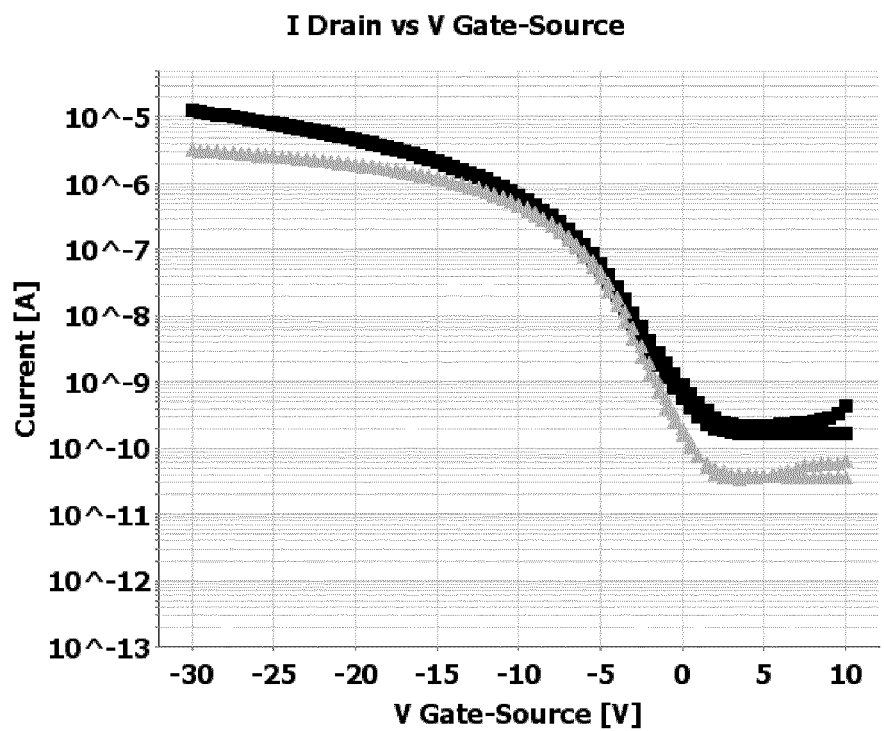
FIG. 3 shows the drain current $I_{ds}$ in relation to the gate voltage $V_{gs}$ (transfer curve) for the top-gate field effect transistor at a source voltage $V_{ds}$ of −5V (triangle), respectively, −30V (square) for the a top-gate field effect transistor comprising a dielectric layer formed from polymer Pc.

The drain current $I_{ds}$ in relation to the gate voltage $V_{gs}$ (transfer curve) for the top-gate field effect transistor at a source voltage $V_{ds}$ of −5V (triangle), respectively, −30V (square) for the a top-gate, bottom-contact field effect transistor comprising a dielectric layer formed from polymer Pc is shown in FIG. 3.

Figure 4:
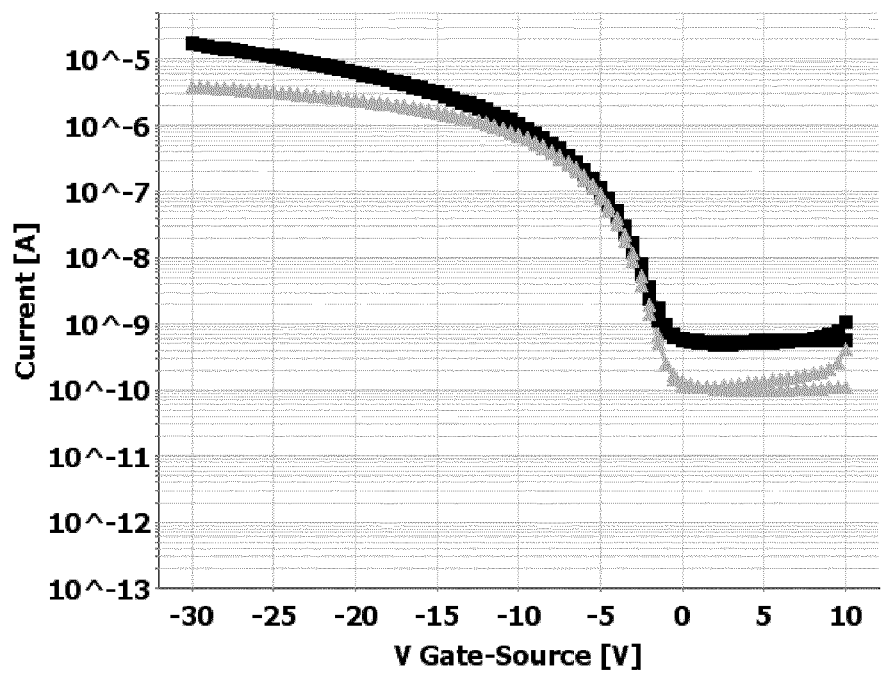
FIG. 4 shows the drain current $I_{ds}$ in relation to the gate voltage $V_{gs}$ (transfer curve) for the top-gate field effect transistor at a source voltage $V_{ds}$ of −5V (triangle), respectively, −30V (square) for the a top-gate field effect transistor comprising a dielectric layer formed from polymer Pd.

The drain current $I_{ds}$ in relation to the gate voltage $V_{gs}$ (transfer curve) for the top-gate field effect transistor at a source voltage $V_{ds}$ of −5V (triangle), respectively, −30V (square) for the a top-gate, bottom-contact field effect transistor comprising a dielectric layer formed from polymer Pd is shown in FIG. 4.

The charge-carrier mobility was extracted in the saturation regime from the slope of the square root drain current $I_{ds}^{1/2}$ versus gate-source voltage $V_{gs}$. The threshold voltage $V_{on}$ was obtained using the following equation: $\mu = 2 I_{ds} / \{(W/L)Ci(V_{gs}-V_{on})^2\}$, wherein Ci is the capacitance per unit of the dielectric layer, and W/L is the ratio between the transistor width and length (W/L=25). The thickness of the dielectric has been measured by a profilometer to 360 nm for Pa and Pb, to 565 nm for polymer Pc, and to 365 nm for polymer Pd.

The average values of the charge carrier mobility μ, the $I_{on}/I_{off}$ ratio and the onset voltage $V_{on}$ for the organic field effect transistors are given in table 1.

TABLE 1

| polymer | styrene:butadiene [g:g] | crosslinker [%]ᵃ | charge carrier mobility [cm²/Vs] | $I_{on}/I_{off}$ | $V_{on}$ [V] | Ig @ −30 V [A] |
|---|---|---|---|---|---|---|
| Pa | 80:20 | 4 | 0.41 | 4E+05 | −1.5 | 5E−08 |
| Pb | 90:10 | 3 | 0.44 | 2E+05 | −0.5 | 1E−07 |
| Pc | 85:15 | 4 | 0.38 | 5E+04 | −3.0 | 2E−08 |
| Pd | 80:20 | 6 | 0.34 | 5E+04 | −2.0 | 8E−08 |

ᵃweight crosslinker based on the weight of polymer [%]

Example 6 (Comparative)

Preparation of random polymer CP1 comprising a styrene and butadiene units with a mass ratio styrene:butadiene of 90:10 and an amount of 1,2-addition of butadiene of 15% based on the total amount of butadiene units In a 10 L stainless steel reactor equipped with a cross-bar stirrer, 5128 ml (4000 g) cyclohexane and 1 g 1,1-diphenylethylene (DPE) were heated to 60° C. and titrated with s-BuLi (1.4 M in cyclohexane) until a stable orange-red color remained (ca. 1.6 mL). Then, 7.14 mL s-BuLi (1.4 M in cyclohexane) and 1.61 mL potassium tert. amylate (0.177 M in cyclohexane) was added to the reaction mixture and immediately 990 mL (900 g) styrene and 153 mL butadiene (100 g) were added at the same time over a period of 60 min. The temperature was kept at 75° C. by counter-cooling of the reactor jacket. Then the reaction mixture was stirred for 30 min followed by the addition of 1.15 mL isopropanol and further stirring for 10 min. The colorless solution was transferred into two 5 L canisters and shaken together with 25 mL water and 50 g dry ice each for purpose of acidification.

Workup

The acidified mixture (solid content 20%) was precipitated into ethanol (10 fold volume containing 0.1% Kerobit TBK with respect to polymer), washed 3 times with 5 L ethanol and 3 times with 1 L distilled water on a Büchi funnel. Finally, the white powder was washed two times with 2.5 L ethanol and four times with 250 mL ethanol and finally dried at 50° C. under vacuum for 24 h. The obtained white powder, polymer CP1, had the following characteristics. Mn=111000 g/mol. Mw=117000 g/mol. PDI 1.05. The mass ratio of styrene and butadiene was 90:10 and the amount of 1,2-addition of butadiene was 15% based on the total amount of butadiene units (as determined by 1H-NMR). Tg (DSC): one transition at 72.8° C.

Example 7 (Comparative)

Preparation of multiblock polymer CP2 comprising a styrene and butadiene units with a mass ratio styrene:butadiene of 90:10 and an amount of 1,2-addition of butadiene of 24% based on the total amount of butadiene units In a 10 L stainless steel reactor equipped with a cross-bar stirrer, 5128 ml (4000 g) cyclohexane and 1 g 1,1-diphenylethylene (DPE) were heated to 60° C. and titrated with s-BuLi (1.4 M in cyclohexane) until a stable orange-red color remained (ca. 1.6 mL). Then, 7.14 mL s-BuLi (1.4 M in cyclohexane) was added to the reaction mixture and immediately 99 ml (90 g) styrene and 15.3 mL butadiene (10 g) were added at the same time under stirring. The temperature was kept at 70° C. controlled by the reactor jacket temperature for 10 min. Then the procedure was repeated further nine times followed by the addition of 1.15 mL isopropanol and further stirring for 10 min. The colorless solution was transferred into two 5 L canisters and shaken together with 25 mL water and 50 g dry ice each for purpose of acidification.

Workup

The acidified mixture (solid content 20%) was precipitated into ethanol (10 fold volume containing 0.1% Kerobit with respect to polymer), washed 3 times with 5 L ethanol and 3 times with 1 L distilled water on a Büchi funnel. Finally, the white powder was washed two times with 2.5 L ethanol and four times with 250 mL ethanol and finally dried at 50° C. under vacuum for 24 h. The obtained white powder, polymer CP2, had the following characteristics: Mn=90000 g/mol. Mw=110000 g/mol. PDI 1.22. The mass ratio of styrene and butadiene was 90:10 and the amount of 1,2-addition of butadiene was 24% based on the total amount of butadiene units (as determined by 1H-NMR). Tg (DSC): one transition at 69.9° C.

Example 8 (Comparative)

Preparation of random polymer CP3 comprising styrene and butadiene units with a mass ratio styrene:butadiene of 90:10 and an amount of 1,2-addition of butadiene of 72% based on the total amount of butadiene units In a 10 L stainless steel reactor equipped with a cross-bar stirrer, 4872 mL (3800 g) cyclohexane, 256 mL (200 g) THF and 1 g 1,1-diphenylethylene (DPE) were heated to 30° C. and titrated with s-BuLi (1.4 M in cyclohexane) until a stable orange-red color remained (ca. 1.8 mL). Then, 7.14 mL s-BuLi (1.4 M in cyclohexane) was added to the reaction mixture and immediately 990 mL (900 g) styrene and 153 mL butadiene (100 g) were added at the same time over a period of 60 min. The temperature was kept at 50° C. by counter-cooling of the reactor jacket. Then, the reaction mixture was stirred for 15 min followed by the addition of 1.15 ml isopropanol and further stirring for 10 min. The colorless solution was transferred into two 5 L canisters and shaken together with 25 ml water and 50 g dry ice each for purpose of acidification.

Workup

The acidified mixture (solid content 20%) was precipitated into ethanol (10 fold volume containing 0.1% Kerobit TBK with respect to polymer), washed 3 times with 5 L ethanol and 3 times with 1 L distilled water on a Büchi funnel. Finally, the white powder was washed two times with 2.5 L ethanol and four times with 250 mL ethanol and finally dried at 50° C. under vacuum for 24 h. The obtained white powder, polymer CP3, had the following characteristics: Mn=206000 g/mol. Mw=230000 g/mol. PDI 1.11. The mass ratio of styrene and butadiene was 90:10 and the amount of 1,2-addition of butadiene was 72% based on the total amount of butadiene units (as determined by 1H-NMR).

Example 9

Evaluation of the effect of the radiation on the retention of polymer layers formed from polymers Pa, Pb, Pc, Pd, CP1, CP2, CP3 and polystyrene (PS) and crosslinking agent carrying two azide groups A solution of 80 mg/mL of polymer Pa prepared as described in example 1 in mixture of propylene glycol monomethyl ether acetate (PGMEA) and cyclopentanone (CP) (70/30) containing 4% by weight of 2,7-bis[2-(4-azido-2,3,5,6-tetrafluoro-phenyl)ethynyl]-9,9-dihexyl-fluorene as crosslinker based on the weight of polymer was filtered through a 1 micrometer filter and applied on a silicon dioxide substrate by spin coating (1800 rpm, 30 seconds). The wet dielectric layer was pre-baked at 90° C. for 2 minutes on a hot plate to obtain a 400 nm thick layer. The polymer dielectric layer was UV-cured using 365 nm (dose of 100 mJ/cm$^2$) under ambient conditions.

The same procedure for the preparation of a polymer dielectric layer as described for polymer Pa above was repeated using polymer Pb prepared as described in example 2, but using 3% instead of 4% by weight of 2,7-bis[2-(4-azido-2,3,5,6-tetrafluoro-phenyl)ethynyl]-9,9-dihexyl-fluorene as crosslinker based on the weight of polymer Pb.

The same procedure for the preparation of a polymer dielectric layer as described for polymer Pa above was repeated using polymer Pc prepared as described in example 3, and polystyrene (PS) from Sigma-Aldrich having a molecular weight Mw of 192000 g/mol.

The same procedure for the preparation of a polymer dielectric layer as described for polymer Pa above was repeated using polymer Pd prepared as described in example 4, but using 6% instead of 4% by weight of 2,7-bis[2-(4-azido-2,3,5,6-tetrafluoro-phenyl)ethynyl]-9,9-dihexyl-fluorene as crosslinker based on the weight of polymer Pd.

The same procedure for the preparation of a polymer dielectric layer as described for polymer Pa above was repeated for comparative polymer CP1 prepared as described in example 6, for comparative polymer CP2 prepared as described in example 7, and for comparative polymer CP3 prepared as described in example 8.

Development of the dielectric layers was done by immersing the dielectric layers into a mixture of propylene glycol monomethyl ether acetate (PGMEA) and cyclopentanone (CP) (70/30) for 1 minute followed by heating at 90° C. for 5 minutes. The thickness of the dielectric layer was measured after curing before development (d1) and after development (d2) using Veeco Dektak 150 to obtain the film retention ratio (d2/d1). The film retention ratios (d2/d1) were determined. The results are shown in table 2.

TABLE 2

| Polymer | styrene:butadiene [g:g] | crosslinker [%]$^a$ | polymer type | Mn [g/mol] | Mw [g/mol] | 1,2-addition butadiene [%] | d2/d1 [%] |
|---|---|---|---|---|---|---|---|
| Pa | 80:20 | 4 | star-shaped | 76000 | 152000 | 9 | 80 |
| Pb | 90:10 | 3 | triblock | 220000 | 330000 | 73 | 81 |
| Pc | 85:15 | 4 | triblock | 140000 | 170000 | 73 | 85 |
| Pd | 80:20 | 6 | triblock | 68000 | 78000 | 73 | 70 |
| CP1 | 90:10 | 4 | random | 111000 | 117000 | 15 | 39 |
| CP2 | 90:10 | 4 | multiblock | 90000 | 110000 | 24 | 52 |
| CP3 | 90:10 | 4 | random | 206000 | 230000 | 72 | 58 |
| PS | 100:0 | 4 | homo | n.a. | 192000 | — | 0 |

$^a$weight crosslinker based on the weight of polymer [%]

Table 2 shows that the film retention ratio of crosslinked polymers Pa, Pb, Pc and Pd is considerably higher than those of crosslinked comparative polymers CP1, CP2 and CP3, and that polystyrene (PS) does not crosslink at all when UV-treated using 365 nm (dose of 100 mJ/cm$^2$) under ambient conditions. All crosslinking reactions were performed under ambient conditions.

The invention claimed is:

1. A composition, comprising:
   a) at least one polymer consisting of one polymer block A and at least two polymer blocks B; and
   b) at least one crosslinking agent carrying at least two azide groups wherein:

each polymer block B is attached to the polymer block A, and at least 60 mol % of the monomer units of polymer block B are selected from the group consisting of:

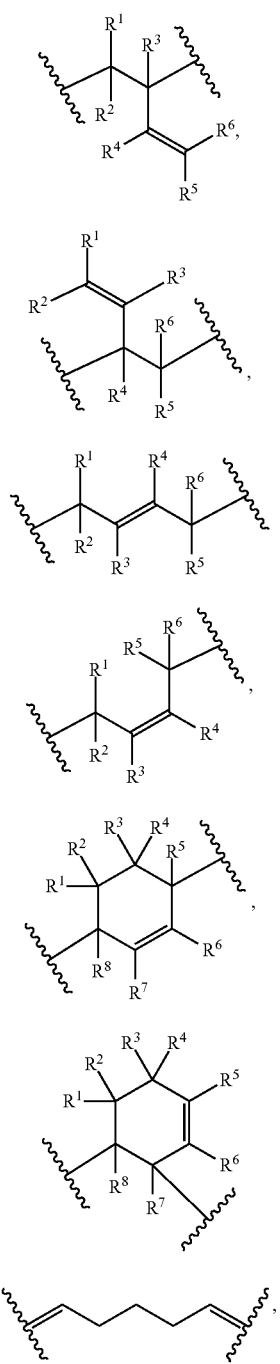

and $R^1$, $R^2$, $R^3$, $R^4$, $R^5$, $R^6$, $R^7$ and $R^8$ are independently and at each occurrence H or $C_{1-4}$-alkyl, wherein the weight ratio of polymer block A/total polymer blocks B is from 70/30 to 96/4 and the polymers have a number average molecular weight Mn of at least 60000 g/mol and a weight average molecular weight Mw of at least 70000 g/mol, both as determined by gel permeation chromatography, with the proviso that at least one of the monomer units (1A) and (1B) is present, and that the ratio of [mols of monomer units (1A) and (1B)]/[mols of monomer units (1A), (1B), (1C) and (1D)] is at least 30%.

2. The composition of claim 1, wherein:
at least 70 mol % of the monomer units of the polymer block B are selected from the group consisting of:

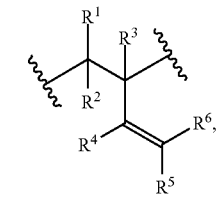

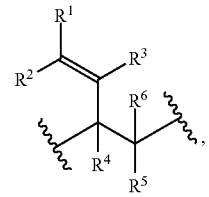

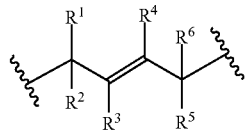

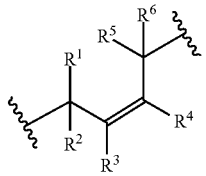

and
$R^1$, $R^2$, $R^3$, $R^4$, $R^5$ and $R^6$ are independently and at each occurrence H or $C_{1-4}$-alkyl.

3. The composition of claim 1, wherein:
at least 80 mol % of the monomer units of the polymer block B are selected from the group consisting of:

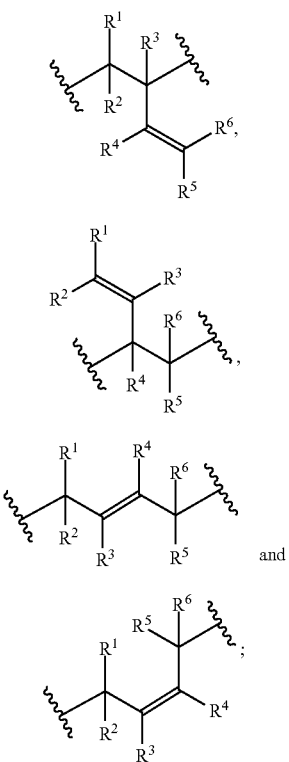

(1A)

(1B)

(1C)

(1D)

and $R^1$, $R^2$, $R^3$, $R^4$, $R^5$ and $R^6$ are H.

4. The composition of claim 1, wherein:

at least 80 mol % of the monomer units of polymer block A are selected from the group consisting of:

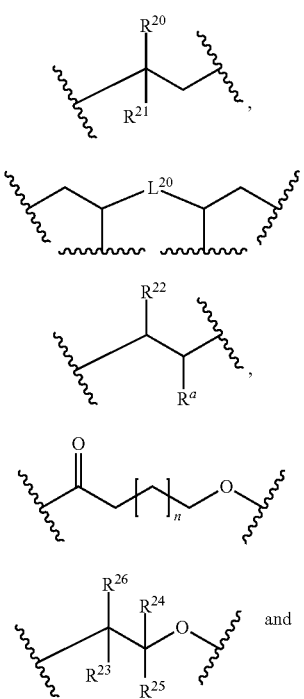

(4A)

(4B)

(4C)

(4D)

(4E)

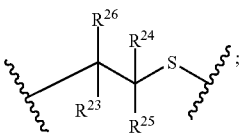

(4F)

$R^{20}$, $R^{21}$, $R^{22}$, $R^{23}$, $R^{24}$, $R^{25}$ and $R^{26}$ are independently and at each occurrence selected from the group consisting of H, $C_{6-14}$-aryl, 5 to 14 membered heteroaryl and $C_{1-30}$-alkyl;

$R^a$ is $C(O)OH$, $C(O)OC_{1-30}$-alkyl, $C(O)$—H, $C(O)C_{6-14}$-aryl, $C(O)N(C_{1-30}$-alkyl$)_2$, $C(O)N(C_{6-14}$-aryl$)_2$, $C(O)N(C_{1-30}$-alkyl$)(C_{6-14}$-aryl$)$, $C(O)$—$C_{6-14}$-aryl, $C(O)$—$C_{1-30}$-alkyl, $O$—$C_{6-14}$-aryl, $O$—$C_{1-30}$-alkyl, $OC(O)C_{1-30}$-alkyl, $OC(O)C_{6-14}$-aryl or CN;

$C_{6-14}$-aryl and 5-14 membered heteroaryl can be substituted with one or more substituents selected from the group consisting of $C_{1-10}$-alkyl, $C(O)OH$, $C(O)OC_{1-10}$-alkyl, $C(O)$phenyl, $C(O)N(C_{1-10}$-alkyl$)_2$, $C(O)N($phenyl$)_2$, $C(O)N(C_{1-10}$-alkyl$)($phenyl$)$, $C(O)$-phenyl, $C(O)$—$C_{1-10}$-alkyl, OH, O-phenyl, O—$C_{1-10}$-alkyl, $OC(O)C_{1-10}$-alkyl, $OC(O)$-phenyl and CN and $NO_2$;

$C_{1-30}$-alkyl can be substituted with one or more substituents selected from the group consisting of with phenyl, $C(O)OH$, $C(O)OC_{1-10}$-alkyl, $C(O)$phenyl, $C(O)N(C_{1-10}$-alkyl$)_2$, $C(O)N($phenyl$)_2$, $C(O)N(C_{1-10}$-alkyl$)($phenyl$)$, $C(O)$-phenyl, $C(O)$—$C_{1-10}$-alkyl, O-phenyl, O—$C_{1-10}$-alkyl, $OC(O)C_{1-10}$-alkyl, $OC(O)$-phenyl, $Si(C_{1-10}$-alkyl$)_3$, $Si($phenyl$)_3$ and CN and $NO_2$;

n is an integer from 1 to 3; and $L^{20}$ is $C_{1-10}$-alkylene, $C_{2-10}$-alkenylene, $C_{2-10}$-alkynylene, $C_{6-14}$-arylene or $S(O)$.

5. The composition according to claim 1, wherein:

at least 80 mol % of the monomer units of polymer block A are selected from the group consisting of:

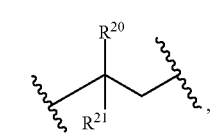

(4A)

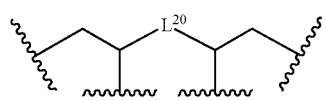

(4B)

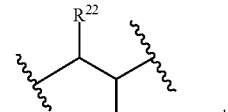

(4C)

and

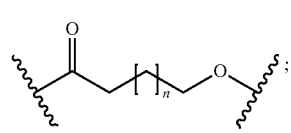

(4D)

$R^{20}$, $R^{21}$ and $R^{22}$ are independently selected from the group consisting of H, $C_{6-14}$-aryl, 5 to 14 membered heteroaryl and $C_{1-30}$-alkyl;

$R^a$ is $C(O)OC_{1-30}$-alkyl;

$C_{6-14}$-aryl and 5-14 membered heteroaryl can be substituted with one or more $C_{1-10}$-alkyl;

$C_{1-30}$-alkyl can be substituted with one or more substituents selected from the group consisting of $Si(C_{1-10}$-alkyl$)_3$ and $Si(phenyl)_3$;

n is an integer from 1 to 3; and $L^{20}$ is $C_{1-10}$-alkylene or $C_{6-14}$-arylene.

6. The composition of claim 1, wherein:

at least 90 mol % of the monomer units of polymer block A is a monomer unit selected from the group consisting of:

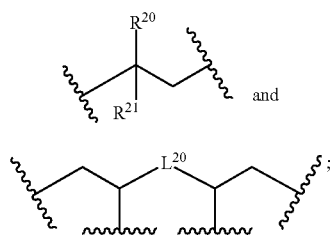

(4A)

(4B)

$R^{20}$ and $R^{21}$ are independently selected from the group consisting of H and $C_{6-14}$-aryl;

$C_{6-14}$-aryl can be substituted with one or more $C_{1-10}$-alkyl; and $L^{20}$ is $C_{6-14}$-arylene.

7. The composition of claim 1, wherein:

the crosslinking agent carrying at least two azide groups is of formula:

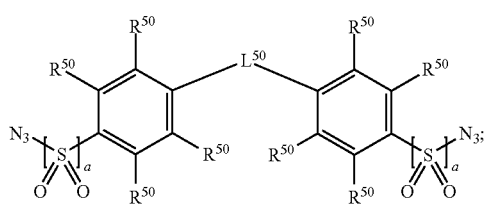

(2)

a is 0 or 1;

$R^{50}$ is at each occurrence selected from the group consisting of H, halogen, $SO_3M$ and $C_{1-20}$-alkyl, which $C_{1-20}$-alkyl can be substituted with one or more halogen, wherein M is H, Na, K or Li; and $L^{50}$ is a linking group.

8. The composition of claim 7, wherein:

$L^{50}$ is a linking group of formula:

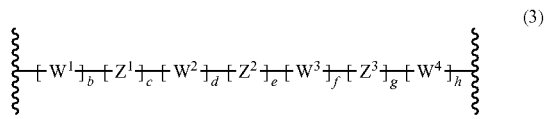

(3)

b, c, d, e, f, g and h are independently from each other 0 or 1, provided that b, c, d, e, f, g and h are not all at the same time 0;

$W^1$, $W^2$, $W^3$ and $W^4$ are independently selected from the group consisting of C(O), C(O)O, C(O)—$NR^{51}$, $SO_2$—$NR^{51}$, $NR^{51}$, $N^+R^{51}R^{51}$, $CR^{51}$=$CR^{51}$ and ethynylene;

$R^{51}$ is at each occurrence H or $C_{1-10}$-alkyl, or two $R^{51}$ groups, which can be from different $W^1$, $W^2$, $W_3$ and $W^4$ groups, together with the connecting atoms form a 5, 6 or 7 membered ring, which may be substituted with one to three $C_{1-6}$-alkyl;

$Z^1$, $Z^2$ and $Z^3$ are independently selected from the group consisting of $C_{1-10}$-alkylene, $C_{5-8}$-cycloalkylene, $C_{6-14}$-arylene, 5 to 14 membered heteroarylene, and polycyclic system containing at least one ring selected from $C_{6-14}$-aromatic ring and 5 to 14 membered heteroaromatic ring; and $C_{1-10}$-alkylene, $C_{5-8}$-cycloalkylene, $C_{6-14}$ membered arylene, 5 to 14 membered heteroarylene and polycyclic system containing at least one ring selected from $C_{6-14}$-aromatic ring and 5 to 14 membered heteroaromatic ring substituted with one to five $C_{1-20}$-alkyl or phenyl.

9. The composition of claim 1, further comprising a solvent.

10. The composition of claim 8, wherein the composition is a solution and comprises;

i) 0.1 to 500 mg of the at least one polymer based on 1000 mg of the composition;

ii) 0.1 to 20% by weight of the at least one crosslinking agent carrying at least two azide groups based on the weight of the one or more polymers; and iii) a solvent.

11. A cured layer formed from the composition of claim 1.

12. An electronic device, comprising the cured layer of claim 11.

13. The electronic device of claim 12, wherein:

the electronic device is an organic field effect transistor; and the layer is the dielectric layer.

* * * * *